United States Patent
Kobayashi et al.

(10) Patent No.: US 10,462,400 B2
(45) Date of Patent: Oct. 29, 2019

(54) SOLID-STATE IMAGING DEVICE AND IMAGING SYSTEM

(71) Applicant: CANON KABUSHIKI KAISHA, Tokyo (JP)

(72) Inventors: Masahiro Kobayashi, Tokyo (JP); Takeshi Ichikawa, Hachioji (JP); Hirofumi Totsuka, Fujisawa (JP); Yusuke Onuki, Fujisawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/008,643

(22) Filed: Jun. 14, 2018

(65) Prior Publication Data
US 2018/0295302 A1     Oct. 11, 2018

Related U.S. Application Data

(63) Continuation of application No. 15/622,809, filed on Jun. 14, 2017, now Pat. No. 10,057,519, which is a
(Continued)

(30) Foreign Application Priority Data

Mar. 14, 2014 (JP) .................................. 2014-051198
Aug. 12, 2014 (JP) .................................. 2014-164106

(51) Int. Cl.
*H01L 27/16* (2006.01)
*H04N 5/361* (2011.01)
(Continued)

(52) U.S. Cl.
CPC ......... *H04N 5/361* (2013.01); *H01L 27/1463* (2013.01); *H01L 27/14603* (2013.01);
(Continued)

(58) Field of Classification Search
CPC combination set(s) only.
See application file for complete search history.

(56) References Cited

U.S. PATENT DOCUMENTS 7,436,343 B2   10/2008   Ichikawa
7,462,810 B2   12/2008   Kobayashi
(Continued)

FOREIGN PATENT DOCUMENTS

CN    10132205    11/2008
CN    102017149    4/2011
(Continued)

OTHER PUBLICATIONS

Chinese Office Action dated Sep. 1, 2017 during prosecution of related Chinese Application No. 201510103714.X. (Whole English-language translation was previously included.).
(Continued)

*Primary Examiner* — Fernando L Toledo
*Assistant Examiner* — Valerie N Newton
(74) *Attorney, Agent, or Firm* — Venable LLP

(57) ABSTRACT

A solid-state imaging device including a plurality of pixels including a photoelectric conversion portion, a charge holding portion accumulating a signal charge transferred from the photoelectric conversion portion, and a floating diffusion region to which the signal charge of the charge holding portion is transferred, wherein the photoelectric conversion portion includes a first semiconductor region of a first conductivity type, and a second semiconductor region of a second conductivity type formed under the first semiconductor region, the charge holding portion includes a third semiconductor region of the first conductivity type, and a fourth semiconductor region of the second conductivity type formed under the third semiconductor region, and a p-n junction between the third semiconductor region and the
(Continued)

fourth semiconductor region is positioned deeper than a p-n junction between the first semiconductor region and the second semiconductor region.

20 Claims, 11 Drawing Sheets

Related U.S. Application Data continuation of application No. 14/640,526, filed on Mar. 6, 2015, now Pat. No. 9,716,849.

(51) Int. Cl.
H01L 27/146 (2006.01)
H04N 5/3745 (2011.01)

(52) U.S. Cl.
CPC .. *H01L 27/14612* (2013.01); *H01L 27/14623* (2013.01); *H04N 5/37452* (2013.01)

(56) References Cited

U.S. PATENT DOCUMENTS

| | | | |
|---|---|---|---|
| 7,633,540 B2 | 12/2009 | Totsuka |
| 7,687,299 B2 | 3/2010 | Ichikawa |
| 7,696,547 B2 | 4/2010 | Ihara |
| 7,928,477 B2 | 4/2011 | Kobayashi |
| 7,935,995 B2 | 5/2011 | Watanabe |
| 7,990,440 B2 | 8/2011 | Kobayashi |
| 8,045,034 B2 | 10/2011 | Shibata |
| 8,084,729 B2 | 12/2011 | Kato |
| 8,115,848 B2 | 2/2012 | Onuki |
| 8,154,639 B2 | 4/2012 | Kato |
| 8,189,081 B2 | 5/2012 | Totsuka |
| 8,289,432 B2 | 10/2012 | Shibata |
| 8,411,185 B2 | 4/2013 | Totsuka |
| 8,427,564 B2 | 4/2013 | Yamashita |
| 8,456,559 B2 | 6/2013 | Yamashita |
| 8,552,353 B2 | 10/2013 | Kobayashi |
| 8,553,118 B2 | 10/2013 | Saito |
| 8,558,293 B2 | 10/2013 | Kawahito |
| 8,605,182 B2 | 12/2013 | Totsuka |
| 8,710,559 B2 | 4/2014 | Kobayashi |
| 8,716,719 B2 | 5/2014 | Matsumura |
| 8,779,544 B2 | 7/2014 | Yamashita |
| 8,866,059 B2 | 10/2014 | Murata |
| 8,884,391 B2 | 11/2014 | Fudaba |
| 8,937,672 B2 | 1/2015 | Totsuka |
| 9,013,765 B2 | 4/2015 | Totsuka |
| 9,147,708 B2 | 9/2015 | Okita |
| 9,153,610 B2 | 10/2015 | Kobayashi |
| 9,716,849 B2 | 7/2017 | Kobayashi |
| 10,057,519 B2 * | 8/2018 | Kobayashi ............. H04N 5/361 |
| 2006/0046338 A1 | 3/2006 | Patrick |
| 2008/0210986 A1 | 9/2008 | Mauritzson |
| 2010/0308384 A1 | 12/2010 | Tsuno |
| 2010/0328302 A1 | 12/2010 | Yamashita |
| 2011/0136291 A1 | 6/2011 | Iwata |
| 2011/0234868 A1 | 9/2011 | Yamashita |
| 2011/0241079 A1 | 10/2011 | Oike |
| 2013/0215300 A1 | 8/2013 | Kobayashi |
| 2014/0061436 A1 | 3/2014 | Kobayashi |
| 2014/0168491 A1 | 6/2014 | Totsuka |
| 2015/0222836 A1 | 8/2015 | Wada |
| 2015/0237315 A1 | 8/2015 | Totsuka |
| 2015/0244963 A1 | 8/2015 | Totsuka |
| 2015/0264287 A1 | 9/2015 | Shimotsusa |
| 2015/0281614 A1 | 10/2015 | Yoshida |
| 2015/0281616 A1 | 10/2015 | Muto |
| 2016/0027825 A1 | 1/2016 | Moriyama |

FOREIGN PATENT DOCUMENTS

| | | |
|---|---|---|
| CN | 102800684 | 11/2012 |
| JP | H11-274465 | 10/1999 |
| JP | 2006-66481 | 3/2006 |
| JP | 2009-182047 | 8/2009 |
| JP | 2010-34890 | 2/2010 |
| JP | 2010-287610 | 12/2010 |
| JP | 2011-222708 | 11/2011 |
| JP | 2011-249569 | 12/2011 |
| JP | 2013-12551 | 1/2013 |
| JP | 2013-171888 | 9/2013 |
| WO | 2011-043432 | 4/2011 |
| WO | 2011/043432 | 4/2011 |

OTHER PUBLICATIONS

Japanese Office Action dated Jun. 21, 2018 during prosecution of related Japanese application No. 2014-164106. (English-language machine translation included.).

Japanese Office Action dated Jan. 29, 2019 during prosecution of related Japanese application No. 2014-164106. (English-language machine translation included.).

* cited by examiner

SOLID-STATE IMAGING DEVICE AND IMAGING SYSTEM

This application is a continuation of U.S. patent application Ser. No. 15/622,809, filed Jun. 14, 2017, which is a continuation of U.S. application Ser. No. 14/640,526, filed Mar. 6, 2015, now U.S. Pat. No. 9,716,849, issued Jul. 25, 2017.

BACKGROUND OF THE INVENTION

Field of the Invention

The present invention relates to a solid-state imaging device and an imaging system.

Description of the Related Art

In recent years, an imaging system such as a digital video camera and a digital camera becomes widespread commonly, which uses a CMOS image sensor therein that is suitable for low power consumption and high-speed readout. In the CMOS image sensor, a sequentially reading out operation (rolling shutter operation) is basic which sequentially reads out pixels in every one row or in every block of several rows, but a CMOS image sensor having a function of a whole-pixel simultaneous electronic shutter is also proposed (refer to International Publication No. WO 11/043432)). Here, the whole-pixel simultaneous electronic shutter is a mechanism of simultaneously controlling the start and end of exposure with light in all of the pixels.

When the area of a charge holding portion is widened or the impurity concentration of the charge holding portion is increased so as to ensure a sufficient amount of saturation electric charges, in the CMOS image sensor, there has been the case where a dark current noise increases which is generated in the charge holding portion and an image quality lowers. In particular, when the whole-pixel simultaneous electronic shutter operates, time periods during which the charge holding portions of the pixels hold signal charges result in being different from each other. Because of this, when the dark current noise is large which is generated in the charge holding portion, the amount of the noise results in being different depending on the positions in the image, and there has been a possibility that a remarkable noise such as shading occurs. In addition, even in the case where the whole-pixel simultaneous electronic shutter is not operated, it is desired that the dark current noise is reduced which is generated in the charge holding portion.

SUMMARY OF THE INVENTION

An object of the present invention is to provide a solid-state imaging device that can reduce a dark current noise which is generated in a charge holding portion that accumulates a signal charge therein.

According to one aspect of the present invention, there is provided a solid-state imaging device including a plurality of pixels each of which includes a photoelectric conversion portion which photoelectrically converts incident light to generate a signal charge; a charge holding portion that accumulates the signal charge transferred from the photoelectric conversion portion; and a floating diffusion region to which the signal charge of the charge holding portion is transferred, wherein the photoelectric conversion portion includes a first semiconductor region of a first conductivity type, and a second semiconductor region of a second conductivity type formed under the first semiconductor region, the charge holding portion includes a third semiconductor region of the first conductivity type, and a fourth semiconductor region of the second conductivity type formed under the third semiconductor region, and a p-n junction between the third semiconductor region and the fourth semiconductor region is positioned deeper than a p-n junction between the first semiconductor region and the second semiconductor region.

According to another aspect of the present invention, there is provided a solid-state imaging device including a plurality of pixels each of which includes a photoelectric conversion portion which photoelectrically converts incident light to generate a signal charge; a charge holding portion that accumulates the signal charge transferred from the photoelectric conversion portion; and a floating diffusion region to which the signal charge of the charge holding portion is transferred, wherein the photoelectric conversion portion includes a first semiconductor region of a first conductivity type, and a second semiconductor region of a second conductivity type formed under the first semiconductor region, the charge holding portion includes a third semiconductor region of the first conductivity type, and a fourth semiconductor region of the second conductivity type formed under the third semiconductor region, and the third semiconductor region has a higher impurity concentration than the first semiconductor region.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings.

[First Embodiment]

A solid-state imaging device according to a first embodiment of the present invention will be described below with reference to FIG. 1 to FIG. 4.

Figure 1:
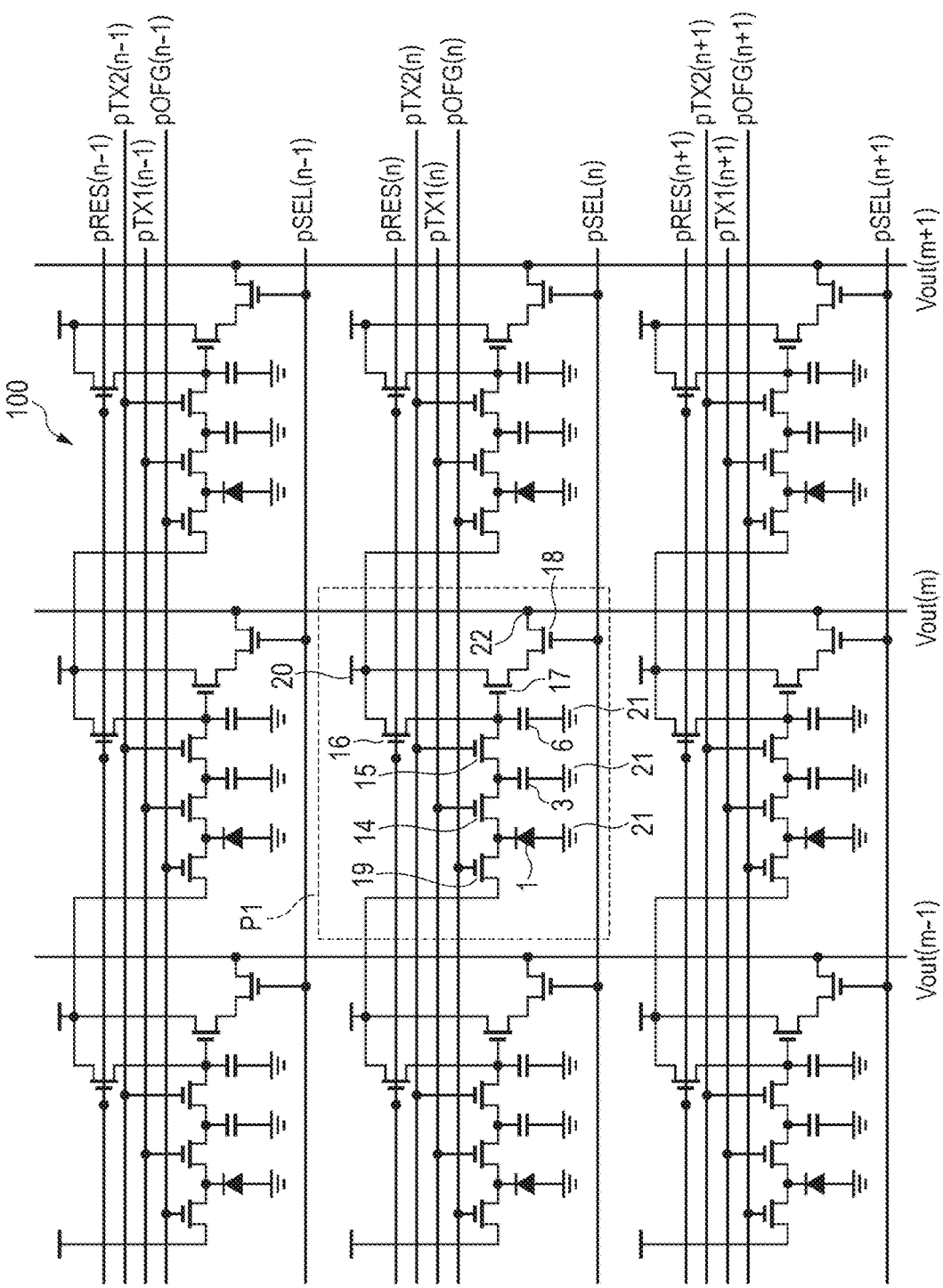
FIG. 1 is a circuit diagram illustrating a configuration of an imaging region of a solid-state imaging device according to a first embodiment of the present invention.
Figure 2:
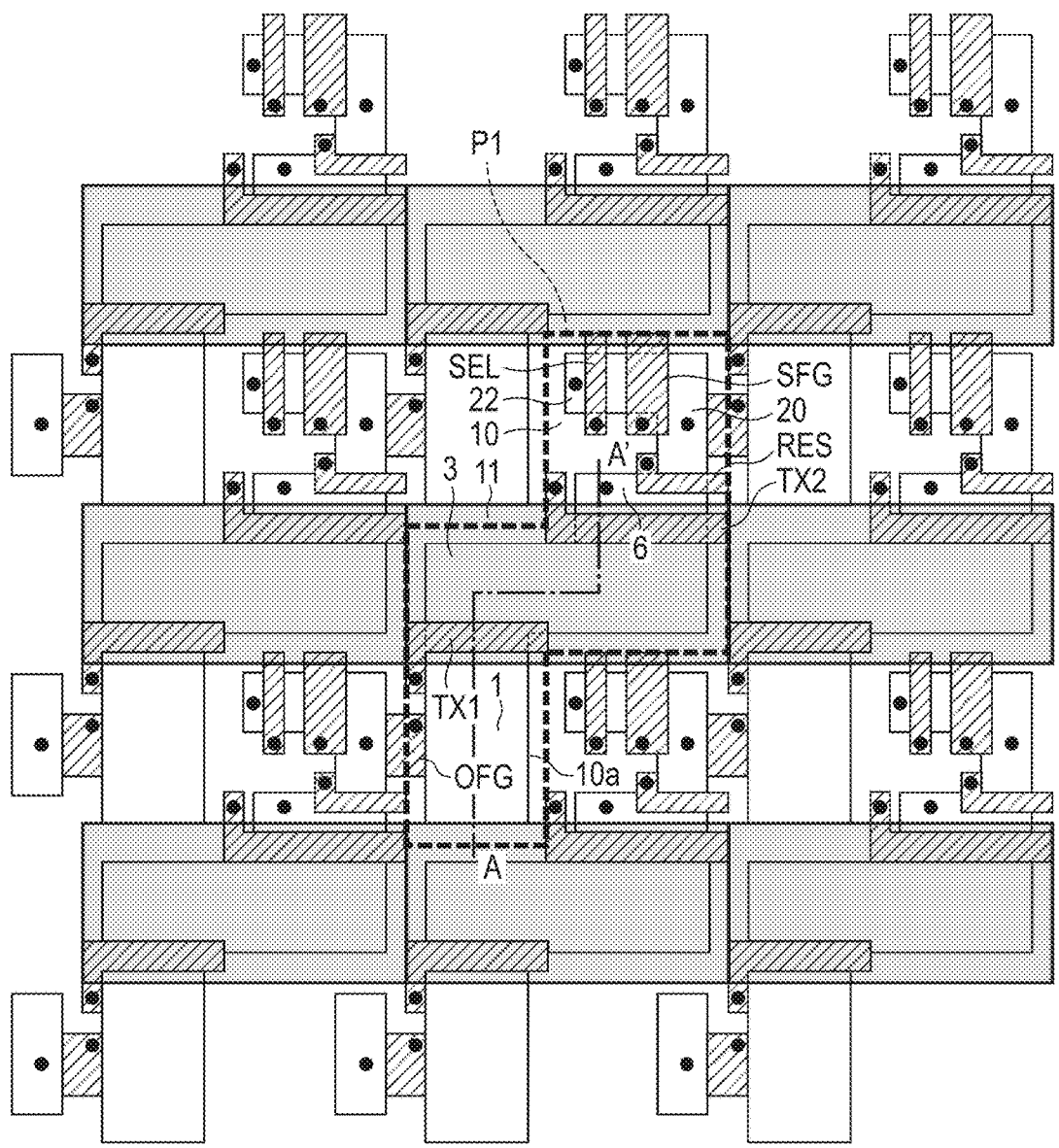
FIG. 2 is a plan view schematically illustrating the structure of the imaging region of the solid-state imaging device according to the first embodiment of the present invention.
Figure 3:
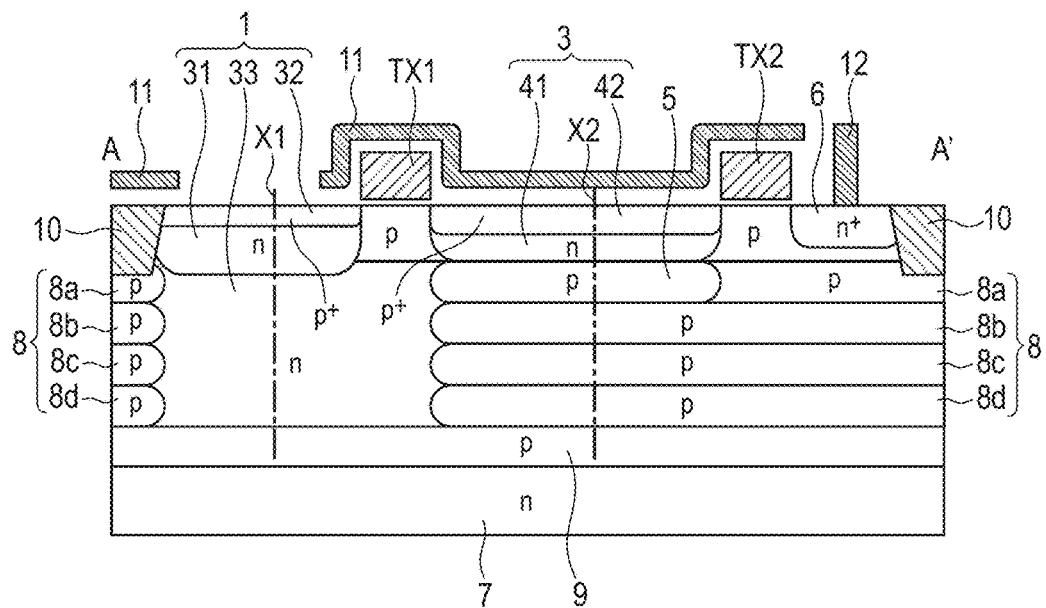
FIG. 3 is a schematic cross-sectional view illustrating the structure of the imaging region of the solid-state imaging device according to the first embodiment of the present invention.
Figure 4:
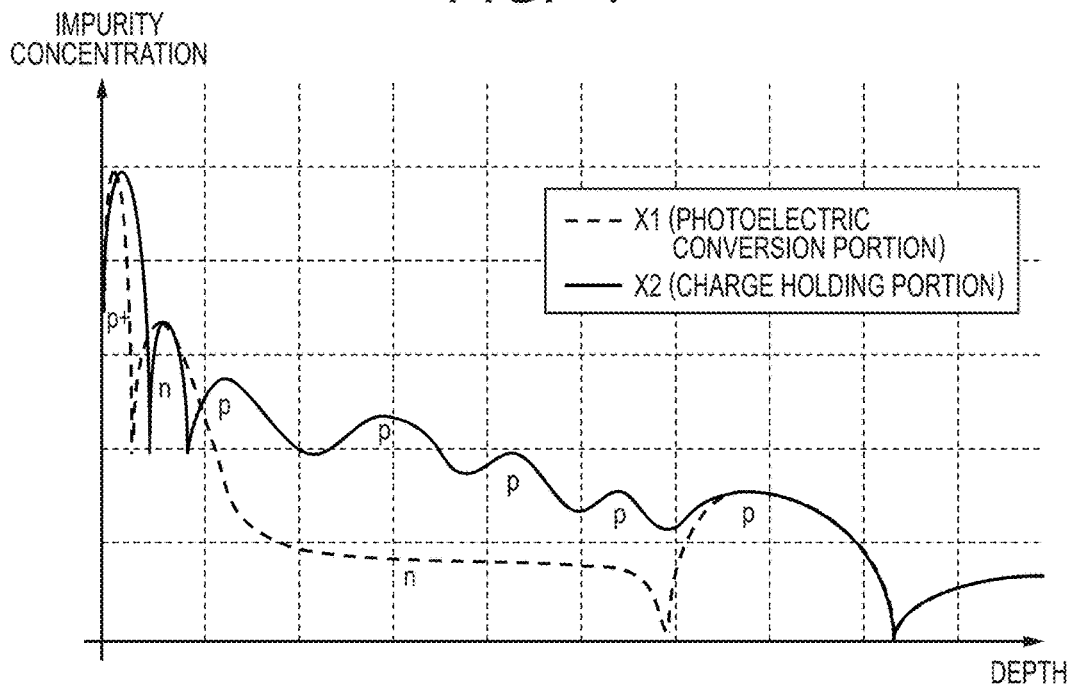
FIG. 4 is a view illustrating distributions of impurity concentration in a photoelectric conversion portion and a charge holding portion in a unit pixel of the solid-state imaging device according to the first embodiment of the present invention.

FIG. 1 is a circuit diagram illustrating a configuration of an imaging region of a solid-state imaging device according to the present embodiment. FIG. 2 is a plan view illustrating a structure of the imaging region of the solid-state imaging device according to the present embodiment. FIG. 3 is a schematic cross-sectional view illustrating the structure of the imaging region of the solid-state imaging device according to the present embodiment. FIG. 4 is a view illustrating distributions of impurity concentration in a depth direction, in a photoelectric conversion portion and a charge holding portion in a unit pixel of the solid-state imaging device according to the present embodiment.

Firstly, the structure of the imaging region of the solid-state imaging device according to the present embodiment will be described below with reference to FIG. 1 to FIG. 4.

The imaging region of the solid-state imaging device 100 according to the present embodiment has a pixel array in which a plurality of unit pixels P1 are arranged in a two-dimensional matrix form along the row direction and the column direction, as is illustrated in FIG. 1. FIG. 1 illustrates the pixel array of three rows and three columns for the simplification of the drawing, but the number of the pixels P1 which are arranged in the row direction and the column direction is not limited in particular. Incidentally, in the present specification, the row direction shall mean a lateral direction in the drawing, and the column direction shall mean a longitudinal direction in the drawing.

The unit pixels P1 each have a photoelectric conversion portion 1, a first transfer transistor 14, a second transfer transistor 15, a reset transistor 16, a source follower transistor 17, a row select transistor 18 and an overflow transistor 19.

The anode of a photodiode which constitutes the photoelectric conversion portion 1 is connected to a ground voltage line 21, and the cathode thereof is connected to both the source of the first transfer transistor 14 and the source of the overflow transistor 19. The drain of the first transfer transistor 14 is connected to the source of the second transfer transistor 15. The drain of the second transfer transistor 15 is connected to both the source of the reset transistor 16 and the gate of the source follower transistor 17. The drain of the reset transistor 16, the drain of the source follower transistor 17 and the drain of the overflow transistor 19 are connected to a power supply voltage line 20. The source of the source follower transistor 17 is connected to the drain of the row select transistor 18.

A connection node between the drain of the first transfer transistor 14 and the source of the second transfer transistor 15 constitutes a charge holding portion 3. In FIG. 1, the charge holding portion 3 is expressed by a capacitor which is connected between the ground voltage line 21 and the connection node between the drain of the first transfer transistor 14 and the source of the second transfer transistor 15.

A connection node among the drain of the second transfer transistor 15, the source of the reset transistor 16, and the gate of the source follower transistor 17 includes a floating diffusion region (hereinafter referred to as "FD region") 6. In FIG. 1, the FD region 6 is expressed by a capacitor which is connected between the ground voltage line 21 and the connection node among the drain of the second transfer transistor 15, the source of the reset transistor 16, and the gate of the source follower transistor 17.

For information, there is the case where the names of the source and the drain of the transistor vary depending on the conductivity type of the transistor, the function that receives attention, or the like, and there is also the case where the names are referred to as names opposite to the above described source and drain.

In each row of the pixel arrays, a signal line pTX1, a signal line pTX2, a signal line pRES, a signal line pSEL and a signal line pOFG are each arranged so as to extend in the row direction. The signal line pTX1 is connected to the gates of the first transfer transistors 14 in the unit pixels P1 which are aligned in the row direction, respectively, and forms a common signal line to these unit pixels Pl. The signal line pTX2 is connected to the gates of the second transfer transistors 15 in the unit pixels P1 which are aligned in the row direction, respectively, and forms a common signal line to these unit pixels P1. The signal line pRES is connected to the gates of the reset transistors 16 in the unit pixels P1 which are aligned in the row direction, respectively, and forms a common signal line to these unit pixels P1. The signal line pSEL is connected to the gates of the row select transistors 18 in the unit pixels P1 which are aligned in the row direction, respectively, and forms a common signal line to these unit pixels P1. The signal line pOFG is connected to the gates of the overflow transistors 19 in the unit pixels P1 which are aligned in the row direction, respectively, and forms a common signal line to these unit pixels P1. Incidentally, in FIG. 1, a number corresponding to a row number n is added to each of the names of the signal lines (for instance, pTX1(n−1), pTX1(n) and pTX1(n+1)).

In each column of the pixel array, a vertical signal line Vout is arranged so as to extend in the column direction. The vertical signal line Vout is connected to the sources (pixel output portion 22) of the row select transistors 18 in the unit pixels P1 which are aligned in the column direction, respectively, and forms a common signal line to these unit pixels P1. In FIG. 1, a number corresponding to a column number m is added to each of the names of the vertical signal lines Vout (for instance, Vout(m−1), Vout (m) and Vout(m+1)).

For information, the row select transistor 18 in the unit pixel P1 may be omitted. In this case, the source of the source follower transistor 17, which functions as the pixel output portion 22, is connected to the vertical signal line Vout.

The pixel array of the circuit configuration illustrated in FIG. 1 can be achieved, for instance, by a planar layout illustrated in FIG. 2. A region (hereinafter referred to as "unit pixel region") which is surrounded by the dotted line in FIG. 2 corresponds to the unit pixel P1. This unit pixel region is repeatedly arranged in the row direction and the column direction, and thereby the pixel array is formed which is an imaging region.

In each of the unit pixel regions, an approximately inverted S-shaped active region 10a is defined by an element isolation region 10. Above the active region 10a, gate electrodes of the respective transistors are arranged. Specifically, gate electrodes TX1, TX2, RES, SFG and SEL are arranged in this order from the lower side of the active region 10a in FIG. 2 so as to traverse the active region 10a. Here, the gate electrode TX1 is the gate electrode of the first transfer transistor 14. The gate electrode TX2 is the gate electrode of the second transfer transistor 15. The gate electrode RES is the gate electrode of the reset transistor 16. The gate electrode SFG is the gate electrode of the source follower transistor 17. The gate electrode SEL is the gate electrode of the row select transistor 18.

In FIG. 2, the photoelectric conversion portion 1 is arranged in the active region 10a in the lower side of the gate electrode TX1. The charge holding portion 3 is arranged in the active region 10a between the gate electrode TX1 and the gate electrode TX2. The FD region 6 is arranged in the active region 10a between the gate electrode TX2 and the gate electrode RES. The active regions 10a of the unit pixels P1 which are adjacent to each other in the row direction are connected in a boundary between the photoelectric conversion portion 1 and the connection portion (drain region of reset transistor 16) to the power supply voltage line 20, and a gate electrode OFG of the overflow transistor 19 is arranged above this connection portion. A light-shielding layer 11 is formed above the charge holding portion 3.

Next, a structure of a portion between the photoelectric conversion portion 1 and the FD region 6 of the solid-state imaging device according to the present embodiment will be described in more detail below with reference to FIG. 3 and FIG. 4. FIG. 3 is a schematic cross-sectional view taken along the line A-A' in FIG. 2. FIG. 4 is a graph which illustrates a distribution of impurity concentration in a depth direction in a portion (photoelectric conversion portion) taken along the X1 line in FIG. 3, and a distribution of impurity concentration in a depth direction in a portion (charge holding portion) taken along the X2 line in FIG. 3. In FIG. 4, a vertical axis represents the impurity concentration (effective carrier concentration) in a form of a logarithmic axis, and both of p-type and n-type impurities are shown in a positive direction. Incidentally, here, an example of the case will be described below where an electron forms a signal charge, but a hole may form the signal charge. In this case, the conductivity type in each of the portions becomes an opposite conductivity type, correspondingly.

The photoelectric conversion portion 1 has a p-type semiconductor region 32 which is formed in the surface portion of a substrate, and an n-type semiconductor region 31 which is formed so as to come in contact with the bottom of the p-type semiconductor region 32, and forms a p-n junction between the n-type semiconductor region 31 and the p-type semiconductor region 32. The photoelectric conversion portion 1 is formed of a buried diode in which the p-n junction between the n-type semiconductor region 31 and the p-type semiconductor region 32 is formed so as to be separated from the surface of the substrate. The buried diode has an effect of being capable of reducing a noise such as a dark current which is generated at the surface of the substrate, because the p-n junction is separated from the surface of the substrate. When minority carriers which have been generated at the surface of the substrate have reached a depletion layer before being recombined, the minority carriers drift toward the n-type semiconductor region 31 of the photoelectric conversion portion 1 due to an electric field in the depletion layer. The minority carriers become easily recombined before reaching the depletion layer, because the p-n junction is separated from the surface of the substrate, which consequently can reduce the noise. Incidentally, it is desirable that the area of the charge holding portion 3 is larger than the area of the photoelectric conversion portion 1, from the viewpoint of enabling all electric charges which have been photoelectrically converted in the photoelectric conversion portion 1 to be transferred to the charge holding portion 3, while ensuring an amount of saturation electric charges. The area in the present specification is an area when the solid-state imaging device is viewed as the plane.

The photoelectric conversion portion 1 further has an n-type semiconductor region 33 which is formed so as to come in contact with the bottom of the n-type semiconductor region 31, and has a lower impurity concentration than the n-type semiconductor region 31 (see FIG. 4). The n-type semiconductor region 33 having the lower impurity concentration is arranged in a deeper portion than the n-type semiconductor region 31, and thereby the n-type semiconductor region 31 can collect even electrons which have been photoelectrically converted in a deep position that is distant from the surface of the substrate. For information, the n-type semiconductor region 33 does not necessarily need to be provided. In place of the n-type semiconductor region 33, a p-type semiconductor region may be provided in a deeper portion than the n-type semiconductor region 31. In this case, the electrons which have been photoelectrically converted in a deep position that is distant from the surface of the substrate can be collected by a depletion layer which extends to the p-type semiconductor region that has been provided in place of the n-type semiconductor region, or by a potential distribution in the p-type semiconductor region.

A p-type buried layer 9 is formed in a deeper portion than the photoelectric conversion portion 1. Thereby, the photoelectric conversion portion 1 is electrically isolated from the n-type semiconductor substrate 7 by a p-type well 8, the buried layer 9, and the like (p-n junction isolation). The buried layer 9 functions as a potential barrier between the photoelectric conversion portion 1 and the n-type semiconductor substrate 7, and has an effect of preventing the photoelectric conversion portion 1 from being mixed with unnecessary electric charges coming from the semiconductor substrate 7, and the like. Incidentally, to be exact, all of the semiconductor regions except for the gate electrode is formed in the semiconductor substrate, but here, a portion deeper than the buried layer 9 out of the semiconductor substrate is referred to as "semiconductor substrate 7", for the sake of convenience. The term simply expressed as "substrate" shall mean the whole of the semiconductor substrate.

The charge holding portion 3 has an n-type semiconductor region 41, and a p-type semiconductor region 42 which is arranged in the surface side of the n-type semiconductor region 41 in terms of the substrate and forms a p-n junction between the p-type semiconductor region 42 and the n-type semiconductor region 41. The charge holding portion 3 is formed of a buried diode which reduces a noise occurring at the surface of the substrate, as in the photoelectric conversion portion 1 which has been previously described.

A p-type depletion suppression portion 5 is formed under the bottom of the charge holding portion 3 so as to come in contact with the n-type semiconductor region 41. The configuration in which the p-n junction is formed by the n-type semiconductor region 41 and the depletion suppression portion 5 has an effect of being capable of making the n-type semiconductor region 41 a completely depleted state and reading out signal charges, at low voltage. As the depletion suppression portion 5 has higher impurity concentration, the signal charges can be transferred at a lower voltage. In addition, the depletion suppression portion 5 also has an effect of preventing the charge holding portion 3 from being mixed with unnecessary electric charges which exist in deeper places than the depletion suppression portion 5.

The charge holding portion 3 and the depletion suppression portion 5 are formed in the p-type well 8. The well 8 existing in the lower part of the depletion suppression portion 5 is formed of layers formed by plural ion implantation steps, and is formed of a p-type semiconductor region which has lower impurity concentration than that of the depletion suppression portion 5 (see FIG. 4). The impurity concentration of the well 8 in the lower part of the depletion suppression portion 5 is configured to be lower than that of the depletion suppression portion 5, and thereby the charge holding portion 3 can be effectively prevented from being mixed with unnecessary electric charges. Incidentally, in FIG. 3, the well 8 is expressed by a plurality of layers 8a, 8b, 8c and 8d in order to visually illustrate that the well 8 is formed of the layers by a plurality of ion implantation steps, but functionally forms one p-type semiconductor region as a whole. The p-type buried layer 9 can also be considered as a part of the well 8. The well 8 does not necessarily need to be formed by a plurality of ion implantation steps, and the number of steps of ion implantation, which is performed so as to form the well 8, is not also limited to the illustrated example.

The light-shielding layer 11 which covers the upper part of the charge holding portion 3 is formed above the charge holding portion 3. The light-shielding layer 11 has an effect of shielding the charge holding portion 3 from incident light, and preventing the generation of unnecessary electric charges other than signal charges which are generated by photoelectric conversion in the photoelectric conversion portion 1. The light-shielding layer 11 generally employs a metal film such as tungsten and aluminum, which has a light-shielding effect against visible light, but is not limited to the above described material.

A gate electrode TX1 is formed above the semiconductor substrate between the photoelectric conversion portion 1 and the charge holding portion 3. Thereby, the first transfer transistor 14 is formed in which the n-type semiconductor region 31 functions as a source region and the n-type semiconductor region 41 functions as a drain region.

In addition, a gate electrode TX2 is formed above the semiconductor substrate between the charge holding portion 3 and the FD region 6. Thereby, the second transfer transistor 15 is formed in which the n-type semiconductor region 41 functions as a source region and the FD region 6 functions as a drain region. The FD region 6 is an n-type semiconductor region. The capacitance of the FD region 6 includes a capacitance of a p-n junction between the p-type well 8 and the n-type FD region 6. A contact plug 12 which is formed on the FD region 6 is a part of an interconnection that electrically connects the FD region 6 with the gate electrode SFG of the source follower transistor 17. Incidentally, the connection node including the FD region 6 may include a parasitic capacitance component due to these interconnections and the contact plug 12.

Next, an operation of the solid-state imaging device according to the present embodiment will be described below with reference to FIG. 1 and FIG. 3.

When light is incident on the photoelectric conversion portion 1, electrons are generated by photoelectric conversion by a photodiode of the photoelectric conversion portion 1, and these electrons are accumulated in the photoelectric conversion portion 1. When the first transfer transistor 14 is driven (turned on), the electrons which have been accumulated in the photoelectric conversion portion 1 are transferred to the charge holding portion 3.

When reading out the signal charges from pixels in a plurality of rows, a CMOS image sensor which does not have the charge holding portion sequentially drives the transfer transistors in each row (drives row by row). On the other hand, the solid-state imaging device having the charge holding portion 3 according to the present embodiment can perform the operation of simultaneously transferring the signal charges in the photoelectric conversion portions 1 in the unit pixels P1 in all of the rows to the respective charge holding portions 3, which is a whole-pixel simultaneous transfer in other words. After the whole-pixel simultaneous transfer, the photoelectric conversion portion 1 becomes a vacant state, in other words, an initial state, and becomes a start state for next exposure with light. Specifically, the solid-state imaging device according to the present embodiment can perform an operation of simultaneously controlling the start and end of exposure with light in all of the pixels, which is an operation of a whole-pixel simultaneous electronic shutter in other words.

After the signal charge has been transferred to the charge holding portion 3 from the photoelectric conversion portion 1, the overflow transistor 19 is driven so as to discharge redundant electric charges from the photoelectric conversion portion 1.

When the second transfer transistor 15 is driven (turned on), the signal charge is read out from the charge holding portion 3 to the FD region 6. When the signal charge is read out from the charge holding portion 3 to the FD region 6, the second transfer transistors 15 in each of the rows are sequentially driven (driven row by row).

When the signal charge has been read out to the FD region 6, the signal charge which has been read out to the FD region 6 is converted into a voltage by the capacitor of the FD region 6 according to the amount of the signal charges, and the voltage is applied to the gate electrode SFG of the source follower transistor 17. The voltage which has been amplified according to the gate voltage that has been applied to the source follower transistor 17 is output to the vertical signal line Vout through the row select transistor 18. Thus, the second transfer transistors 15 in each of the rows are sequentially driven, and thereby the output signals sent from all of the pixels can be read out.

Here, because the signal is read out from the charge holding portion 3 to the FD region 6 row by row as has been described above, the time period during which the signal charge is held in the charge holding portion 3 varies depending on the position (row) of the unit pixel P1 in the screen, in other words, in the pixel array. Specifically, in a row in which a holding time period necessary for the signal charge to be transferred from the charge holding portion 3 to the FD region 6 is long, the signal charge results in being more largely affected by a dark current noise which is generated at the surface of the substrate of the charge holding portion 3, and the like. Furthermore, when the area of the charge holding portion 3 has been increased so as to ensure the saturation electric charge, the surface area of the interface increases, and accordingly the influence of the noise further increases. Incidentally, in a process of transferring the signal charge from the photoelectric conversion portion 1 to the charge holding portion 3, all of the pixels are simultaneously controlled, and accordingly the influences of the noise are not different in the screen.

For this reason, in the solid-state imaging device according to the present embodiment, in order to reduce the above described influence of the noise in the screen, the p-type semiconductor region 42 of the charge holding portion 3 is formed so as to be thicker and deeper than the p-type semiconductor region 32 of the photoelectric conversion portion 1, as is illustrated in FIG. 3 and FIG. 4. Thereby, a depletion layer region which is formed in the p-n junction between the n-type semiconductor region 41 and the p-type semiconductor region 42 of the charge holding portion 3 becomes away from the surface of the substrate, and the influence of the dark current noise can be reduced.

Incidentally, when the p-type semiconductor region 32 of the photoelectric conversion portion 1 is thickened, the p-n junction surface of the photoelectric conversion portion 1 becomes away from the surface of the substrate, and a photoelectric conversion efficiency of the incident light having a short wavelength decreases. Then, there is a concern that the gradation of a color component having a short wavelength such as blue, for instance, results in being lowered. Because of this, it is not necessarily desirable to thicken both the p-type semiconductor region 32 of the photoelectric conversion portion 1 and the p-type semiconductor region 42 of the charge holding portion 3. From such a viewpoint, it is desirable to form the p-type semiconductor region 42 of the charge holding portion 3 so as to be thicker and deeper than the p-type semiconductor region 32 of the photoelectric conversion portion 1, regardless of the p-type semiconductor region 32 of the photoelectric conversion portion 1.

Methods for forming the p-type semiconductor region 42 of the charge holding portion 3 so as to be deeper than the p-type semiconductor region 32 of the photoelectric conversion portion 1 include a method of appropriately changing ion implantation conditions, as one example. For instance, an acceleration voltage for the ion implantation of a p-type impurity, which is set when the p-type semiconductor region 32 is formed, is set at a higher voltage than an accelerating voltage for the ion implantation of a p-type impurity, which is set when the p-type semiconductor region 42 is formed, and thereby the p-type semiconductor region 32 can be formed into a deeper place. Alternatively, it is also possible to set the acceleration voltage for the ion implantation of an n-type impurity, which is set when the n-type semiconductor region 41 is formed, at a higher voltage than the accelerating voltage for the ion implantation of an n-type impurity, which is set when the n-type semiconductor region 31 is formed, and to form the p-n junction of the charge holding portion 3 so as to be deeper than the p-n junction of the photoelectric conversion portion 1. For information, the forming method is not limited to the above described methods, and can be appropriately changed in the range in which the present embodiment can be applied.

Thus, according to the present embodiment, the p-n junction of the charge holding portion is formed so as to be deeper than the p-n junction of the photoelectric conversion portion, and accordingly a dark current noise which is generated in the charge holding portion is reduced, and a noise component which is superimposed on a signal output from a pixel can be reduced. In addition, when the whole-pixel simultaneous electronic shutter is operated, a difference of the amount of the noise among the positions in the pixels can be reduced. Thereby, a solid-state imaging device can be achieved which has high performance and can obtain the image information of high quality.

[Second Embodiment]

A solid-state imaging device according to a second embodiment of the present invention will be described below with reference to FIG. 5 and FIG. 6. Similar components to those in the solid-state imaging device according to the first embodiment illustrated in FIG. 1 to FIG. 4 are designated by the same reference numerals, and the description will be omitted or simplified.

Figure 5:
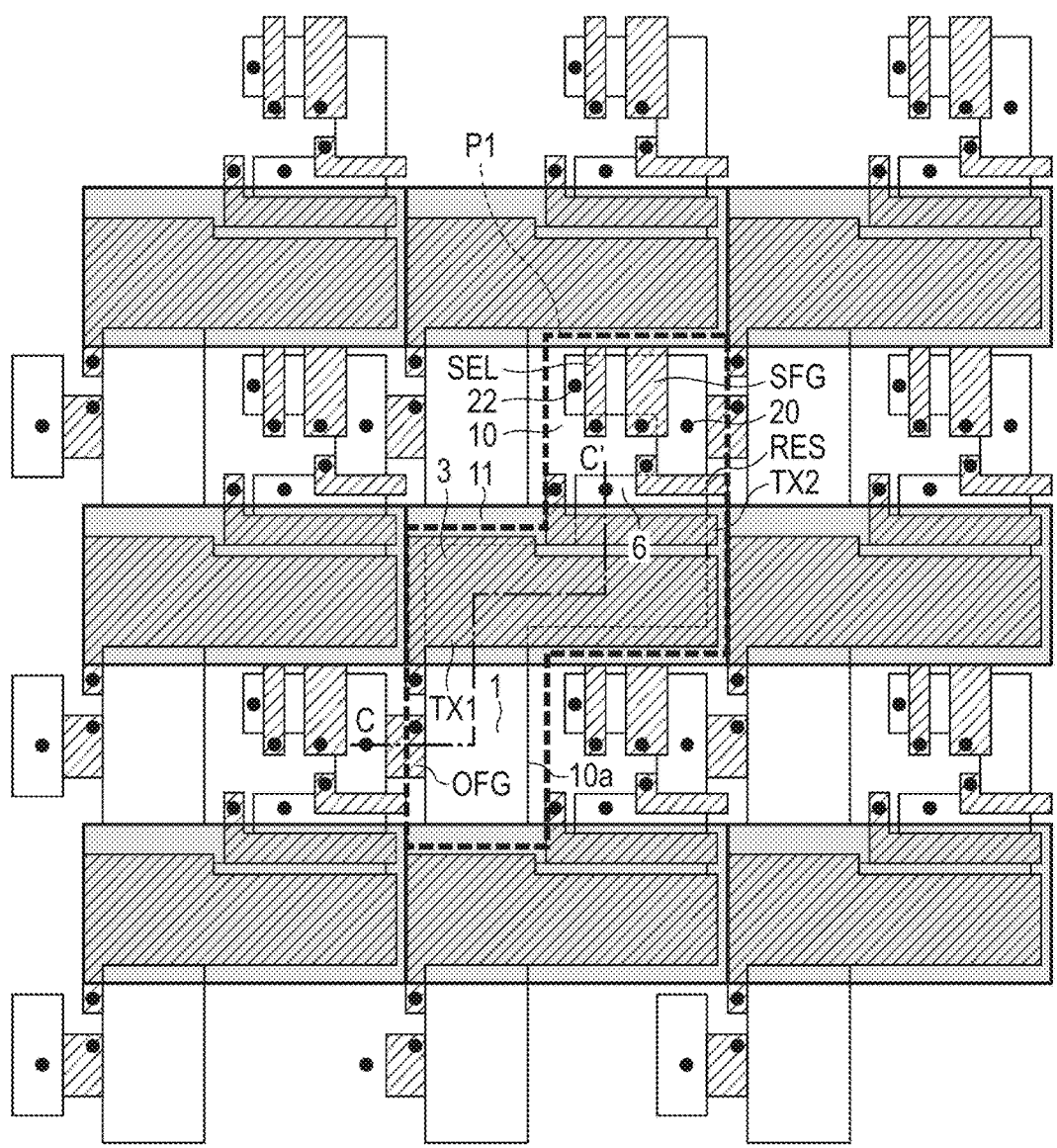
FIG. 5 is a plan view schematically illustrating a structure of an imaging region of a solid-state imaging device according to a second embodiment of the present invention.

FIG. 5 is a plan view illustrating a structure of a solid-state imaging device according to the present embodiment. FIG. 6 is a schematic cross-sectional view illustrating the structure of the solid-state imaging device according to the present embodiment. Incidentally, FIG. 6 is a cross-sectional view taken along the line C-C' in FIG. 5.

Figure 6:
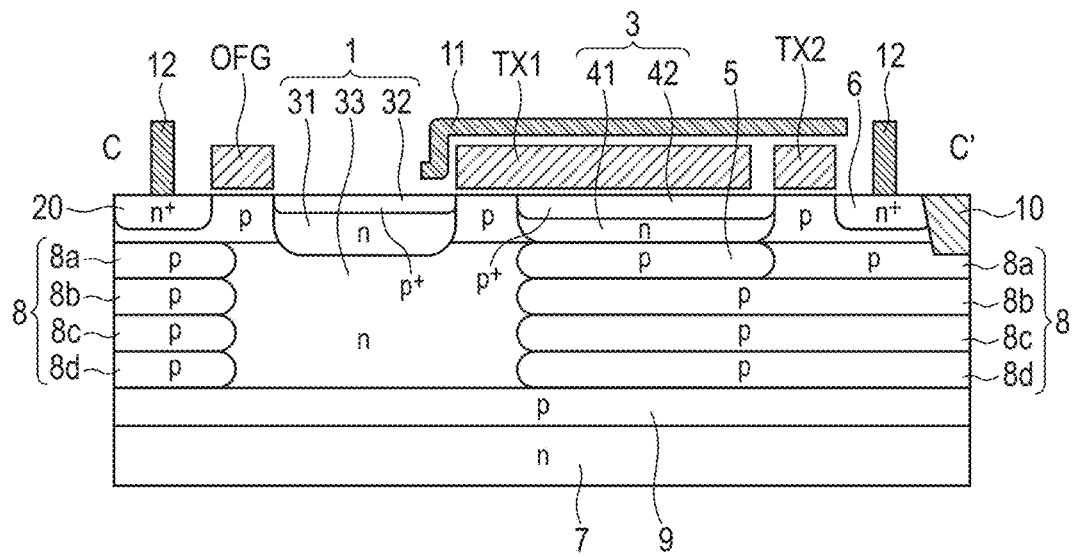
FIG. 6 is a schematic cross-sectional view illustrating the structure of the imaging region of the solid-state imaging device according to the second embodiment of the present invention.

The solid-state imaging device according to the present embodiment is similar to the solid-state imaging device according to the first embodiment, except that the pattern of the gate electrode TX1 of the first transfer transistor 14 is different from that in the first embodiment, as is illustrated in FIG. 5 and FIG. 6. Specifically, in the solid-state imaging device according to the present embodiment, the gate electrode TX1 of the first transfer transistor 14 is formed not only in the region between the photoelectric conversion portion 1 and the charge holding portion 3, but also is formed so as to extend to the upper part of the charge holding portion 3.

The gate electrode TX1 is formed into such a pattern, and thereby the potential can be lowered in the most regions of the charge holding portion 3, when an ON voltage has been applied to the gate electrode TX1 of the first transfer transistor 14, when the electric charge is transferred from the photoelectric conversion portion 1 to the charge holding portion 3. Thereby, the electric charges can be easily transferred from the photoelectric conversion portion 1 to the charge holding portion 3.

The structure in which the electric charges are easily transferred shows also an effect of lowering the ON voltage of the first transfer transistor 14 than an ON voltage in the case where the gate electrode TX1 does not extend to the upper part of the charge holding portion 3, and being capable of reducing the electric power consumption.

In addition, when an OFF voltage is applied to the gate electrode TX1 of the first transfer transistor 14, the pinning of the surface of the substrate can be performed, which originates in that there is the p-type semiconductor region 42 of the charge holding portion 3 and besides the first transfer transistor 14 is set at the OFF voltage. Thereby, the dark current noise of the charge holding portion 3 can be further reduced.

Thus, according to the present embodiment, the gate electrode TX1 of the first transfer transistor 14 is formed so as to extend to the upper part of the charge holding portion 3. Accordingly, the electric charges can be easily transferred from the photoelectric conversion portion 1 to the charge holding portion 3, and also the dark current noise of the charge holding portion 3 can be further reduced.

[Third Embodiment]

A solid-state imaging device according to a third embodiment of the present invention will be described below with reference to FIG. 7 and FIG. 8. Similar components to those in the solid-state imaging devices according to the first and second embodiments illustrated in FIG. 1 to FIG. 6 are designated by the same reference numerals, and the description will be omitted or simplified.

Figure 7:
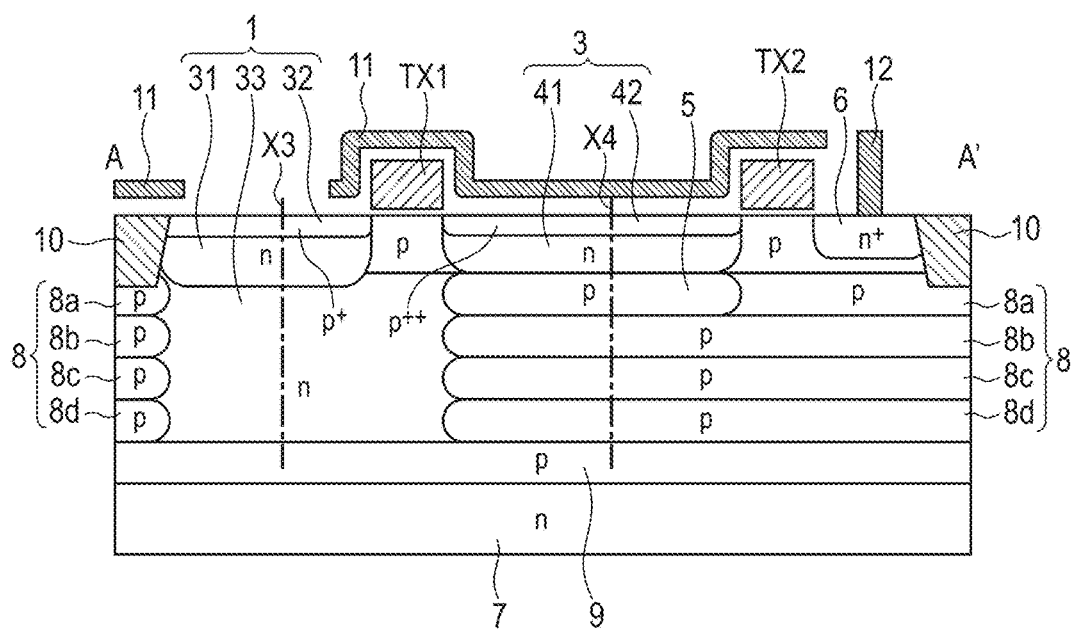
FIG. 7 is a schematic cross-sectional view illustrating a structure of an imaging region of a solid-state imaging device according to a third embodiment of the present invention.

FIG. 7 is a schematic cross-sectional view illustrating a structure of a solid-state imaging device according to the present embodiment. FIG. 8 is a view illustrating distributions of impurity concentration in a depth direction, in a photoelectric conversion portion and a charge holding portion in the solid-state imaging device according to the present embodiment. Incidentally, FIG. 7 is a cross-sectional view of a portion corresponding to the portion taken along the line A-A' in FIG. 2. In addition, FIG. 8 is a graph illustrating a distribution of impurity concentration in a depth direction, in each of a portion (photoelectric conversion portion) taken along the X3 line in FIG. 7, and a portion (charge holding portion) taken along the X4 line in FIG. 7. In FIG. 8, a vertical axis represents the impurity concentration (effective carrier concentration) in a form of a logarithmic axis, and both of p-type and n-type impurities are shown in a positive direction.

Figure 8:
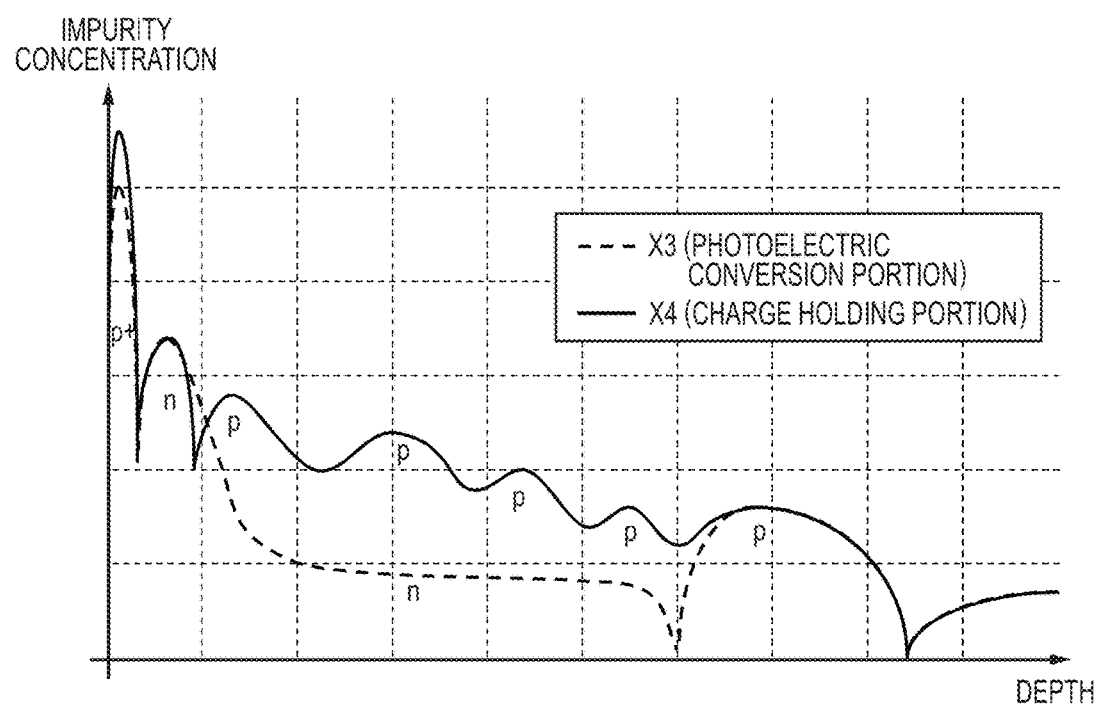
FIG. 8 is a view illustrating distributions of impurity concentration in a photoelectric conversion portion and a charge holding portion in a unit pixel of the solid-state imaging device according to the third embodiment of the present invention.

The solid-state imaging device according to the present embodiment is similar to the solid-state imaging device according to the first embodiment, except that the profile of the impurity in the p-type semiconductor region 42 of the charge holding portion 3 is different from that in the first embodiment, as is illustrated in FIG. 7 and FIG. 8. Specifically, in the solid-state imaging device according to the present embodiment, the impurity concentration of the p-type semiconductor region 42 of the charge holding portion 3 is higher than the case in the first embodiment illustrated in FIG. 4.

When the impurity concentration of the p-type semiconductor region 42 of the charge holding portion 3 is controlled so as to become high, a depletion layer region which is generated at the p-n junction between the n-type semiconductor region 41 and the p-type semiconductor region 42 of the charge holding portion 3 becomes away from the surface of the substrate. This is because as the semiconductor region has a higher impurity concentration, the width of the depletion layer which extends from the p-n junction is smaller. As a result, the influence of the dark current noise can be reduced.

Incidentally, when the impurity concentration in the p-type semiconductor region 32 of the photoelectric conversion portion 1 has been controlled so as to become high, the depletion layer region which is generated at the p-n junction between the n-type semiconductor region 41 and the p-type semiconductor region 42 is further widened to the side of the n-type semiconductor region 41. Accordingly, there is a concern that a photoelectric conversion efficiency of incident light having a short wavelength decreases. Because of this, it is not necessarily desirable to control impurity concentrations of both the p-type semiconductor region 32 of the photoelectric conversion portion 1 and the p-type semiconductor region 42 of the charge holding portion 3 so as to become high. From such a viewpoint, it is desirable to form the p-type semiconductor region 42 of the charge holding portion 3 so as to have a higher impurity concentration than that in the p-type semiconductor region 32 of the photoelectric conversion portion 1, regardless of the p-type semiconductor region 32 of the photoelectric conversion portion 1.

Methods for forming the p-type semiconductor region 42 of the charge holding portion 3 so as to have a higher impurity concentration than that in the p-type semiconductor region 32 of the photoelectric conversion portion 1 include appropriately changing ion implantation conditions, as one example. For instance, an ion implantation step for forming the p-type semiconductor region 32 is separated from an ion implantation step for forming the p-type semiconductor region 42, and the dose in ion implantation is increased, which is set when the p-type semiconductor region 42 is formed. Thereby the impurity concentration in the p-type semiconductor region 42 can be controlled so as to become high. Alternatively, after the ions have been implanted into the photoelectric conversion portion 1 and the charge holding portion 3 on the ion implantation conditions of the p-type semiconductor region 32, ions are additionally implanted into the charge holding portion 3. Thereby the impurity concentration in the p-type semiconductor region 42 can be controlled so as to become high. For information, the forming method is not limited to the above described methods, and can be appropriately changed in the range in which the present embodiment can be applied.

Thus, according to the present embodiment, the p-type semiconductor region 42 of the charge holding portion 3 is formed so as to have the higher impurity concentration than that in the p-type semiconductor region 32 of the photoelectric conversion portion 1, and accordingly the dark current noise of the charge holding portion can be reduced.

[Fourth Embodiment]

A solid-state imaging device according to a fourth embodiment of the present invention will be described below with reference to FIG. 9A and FIG. 9B. Similar components to those in the solid-state imaging devices according to the first to third embodiments illustrated in FIG. 1 to FIG. 8 are designated by the same reference numerals, and the description will be omitted or simplified.

Figure 9A:
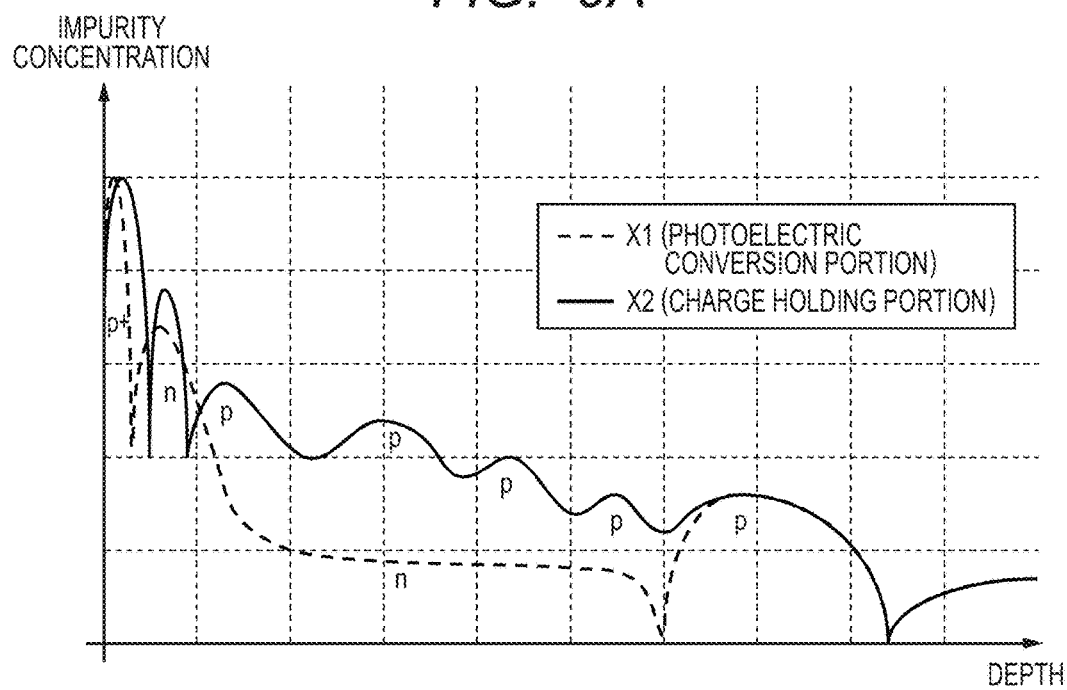
FIG. 9A and FIG. 9B are views illustrating distributions of impurity concentration in each of photoelectric conversion portions and charge holding portions in a unit pixels of solid-state imaging devices according to a fourth embodiment of the present invention.
Figure 9B:
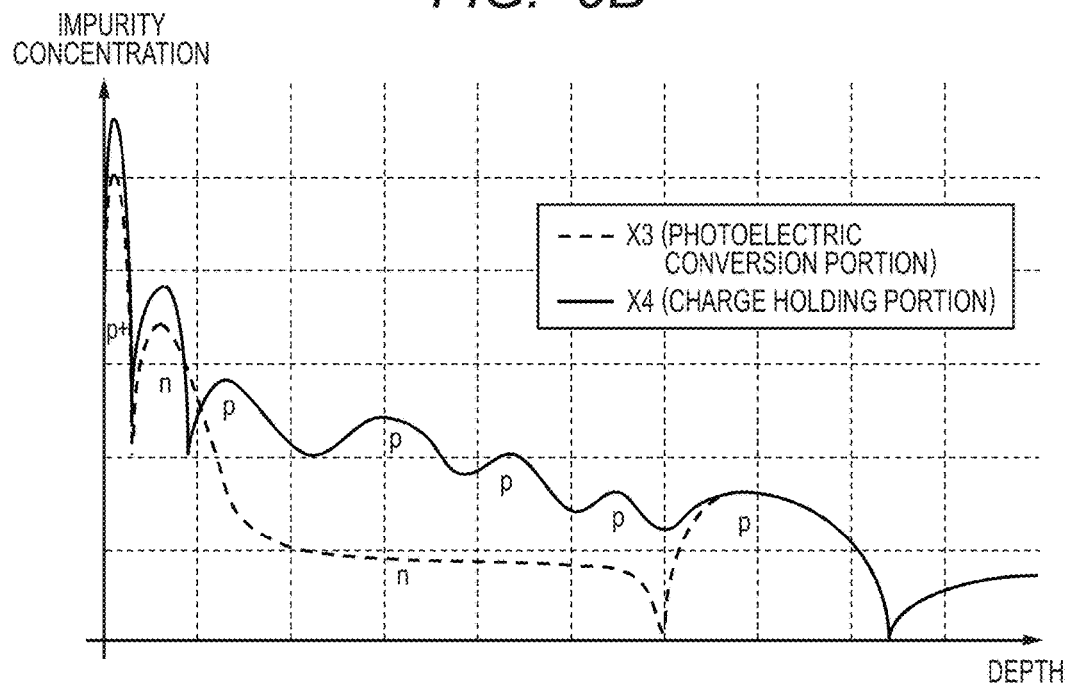

FIG. 9A and FIG. 9B are views illustrating distributions of impurity concentrations in a depth direction, in each of photoelectric conversion portions and charge holding portions of solid-state imaging devices according to the present embodiment. Incidentally, FIG. 9A is a graph illustrating distributions of impurity concentration in a depth direction, in a portion (photoelectric conversion portion) taken along the X1 line in FIG. 3, and a portion (charge holding portion) taken along the X2 line in FIG. 3. FIG. 9B is a graph illustrating distributions of impurity concentration in a depth direction, in a portion (photoelectric conversion portion) taken along the X3 line in FIG. 7, and a portion (charge holding portion) taken along the X4 line in FIG. 7. In FIG. 9A and FIG. 9B, a vertical axis represents the impurity concentration (effective carrier concentration) in a form of a logarithmic axis, and both of p-type and n-type impurities are shown in a positive direction.

The solid-state imaging device according to the present embodiment is configured to be similar to the solid-state imaging devices according to the first to third embodiments, except that profiles of the impurity in the re-type semiconductor region 41 of the charge holding portion 3 are different from those in the first to third embodiments. Specifically, in the solid-state imaging device according to the present embodiment, the impurity concentration in the n-type semiconductor region 41 of the charge holding portion 3 becomes higher than the impurity concentration in the n-type semiconductor region 31 of the photoelectric conversion portion 1, as is illustrated in FIG. 9A and FIG. 9B.

Here, FIG. 9A illustrates the distribution of impurity concentration in a depth direction, in each of the photoelectric conversion portion 1 and the charge holding portion 3, in the case where the configuration of the present embodiment has been applied to the solid-state imaging device of the first or second embodiment. In addition, FIG. 9B illustrates the distribution of impurity concentration in a depth direction, in each of the photoelectric conversion portion 1 and the charge holding portion 3, in the case where the configuration of the present embodiment has been applied to the solid-state imaging device of the third embodiment.

The reason will be described below why the n-type semiconductor region 41 of the charge holding portion 3 is formed so as to have a higher impurity concentration than an impurity concentration in the n-type semiconductor region 31 of the photoelectric conversion portion 1, in the solid-state imaging device according to the present embodiment.

The first reason is because the amount of electric charges which can be accumulated by the charge holding portion 3 becomes larger than the amount of electric charges which can be accumulated by the photoelectric conversion portion 1. The amount of saturation electric charges in the solid-state imaging device of the present invention is the amount of electric charges that can be accumulated by a portion in which the signal charge is accumulated when being read out row by row, specifically, by the charge holding portion 3. If the amount of electric charges which can be accumulated by the photoelectric conversion portion 1 is larger than the amount of electric charges which can be accumulated by the charge holding portion 3, all of the electric charges which have been photoelectrically converted in the photoelectric conversion portion 1 cannot be transferred to the charge holding portion 3, and the amount of the saturation electric charges is limited by the amount of the electric charges which can be accumulated by the charge holding portion 3. On the contrary, if the amount of electric charges which can be accumulated by the photoelectric conversion portion 1 is smaller than the amount of electric charges which can be accumulated by the charge holding portion 3, the amount of saturation electric charges can be set so as to be the amount of electric charges which can be accumulated by the charge holding portion 3, through an operation of transferring the electric charges from the photoelectric conversion portion 1 to the charge holding portion 3 multiple times. Accordingly, in order to ensure the amount of the saturation electric charges within a limited region, the amount of the electric charges which can be accumulated by the charge holding portion 3 can be set so as to be larger than the amount of the electric charges which can be accumulated by the photoelectric conversion portion 1.

The amount of the saturation electric charges in the photoelectric conversion portion 1 can be increased more than the amount of the electric charges which can be accumulated by the charge holding portion 3, through the operation of transferring the electric charges from the charge holding portion 3 to the FD region 6 multiple times. However, in this case as well, the amount of the electric charges which can be accumulated by the charge holding portion 3 can be set so as to be larger than the amount of the electric charges which can be accumulated by the photoelectric conversion portion 1.

The second reason is because the amount of saturation electric charges in the charge holding portion 3 is ensured. In the deep portion of the charge holding portion 3, the depletion suppression portion 5 of the p-type is formed which is an opposite conductivity type, and accordingly the concentration of the n-type impurity in the n-type semiconductor region 41 which is formed on the upper part of the depletion suppression portion 5 results in being small, compared to that in the n-type semiconductor region 31. When the n-type semiconductor region 41 of the charge holding portion 3 is formed so as to have a higher impurity concentration than an impurity concentration in the n-type semiconductor region 31 of the photoelectric conversion portion 1, the decrease of the concentration of the n-type impurity in the n-type semiconductor region 41 is suppressed, and a sufficient amount of saturation electric charges can be ensured.

As has been described in the two reasons, it is appropriate to form the n-type semiconductor region 41 of the charge holding portion 3 so as to have a higher impurity concentration than an impurity concentration in the n-type semiconductor region 31 of the photoelectric conversion portion 1.

However, if the n-type semiconductor region 41 of the charge holding portion 1 is simply formed so as to have a high impurity concentration, the concentration of the p-type impurity in the p-type semiconductor region 42 of the charge holding portion 1 decreases, and the charge holding portion results in being easily affected by the dark current noise on the surface of the substrate.

For this reason, it is desirable to form the p-type semiconductor region 42 of the charge holding portion 3 so as to be thicker and deeper than the p-type semiconductor region 32 of the photoelectric conversion portion 1, as is illustrated in FIG. 9A. Alternatively, it is desirable to form the p-type semiconductor region 42 of the charge holding portion 3 so as to have a higher impurity concentration than that in the p-type semiconductor region 32 of the photoelectric conversion portion 1, as is illustrated in FIG. 9B. By having such a configuration, the solid-state imaging device can suppress the influence of the dark current noise in the charge holding portion 3 and increase the amount of the saturation electric charges therein, at the same time.

Thus, according to the present embodiment, the n-type semiconductor region 41 of the charge holding portion 3 is formed so as to have a higher impurity concentration than that in the n-type semiconductor region 31 of the photoelectric conversion portion 1, and accordingly the amount of the saturation electric charges can be increased.

[Fifth Embodiment]

A solid-state imaging device according to a fifth embodiment of the present invention will be described below with reference to FIG. 10A and FIG. 10B. Similar components to those in the solid-state imaging devices according to the first to fourth embodiments illustrated in FIG. 1 to FIG. 9B are designated by the same reference numerals, and the description will be omitted or simplified.

Figure 10A:
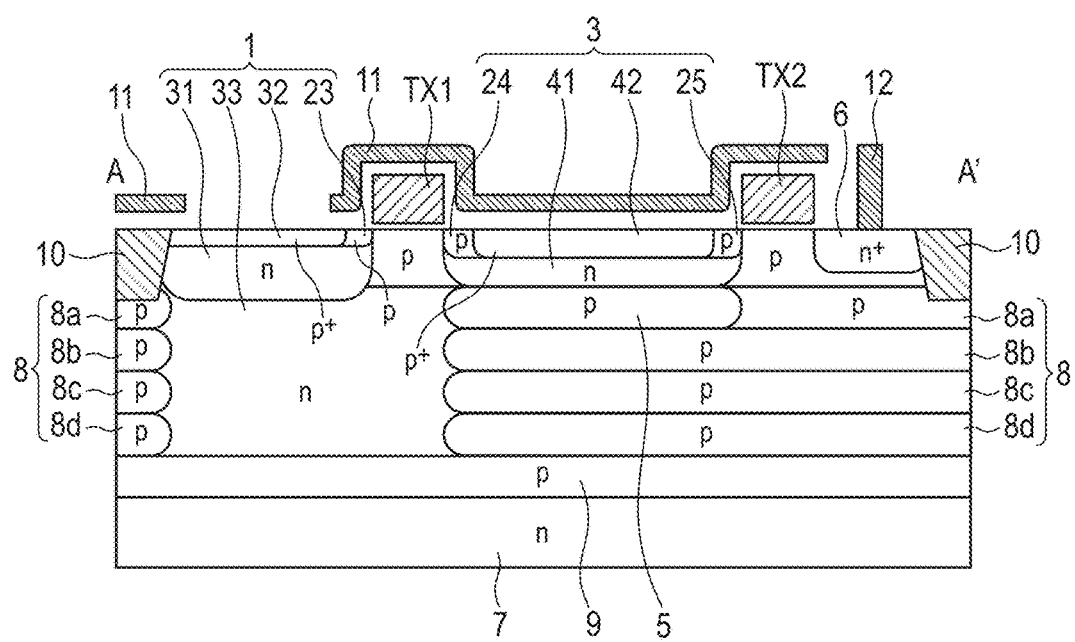
FIG. 10A and FIG. 10B are schematic cross-sectional views illustrating structures of imaging regions of solid-state imaging devices according to a fifth embodiment of the present invention.
Figure 10B:
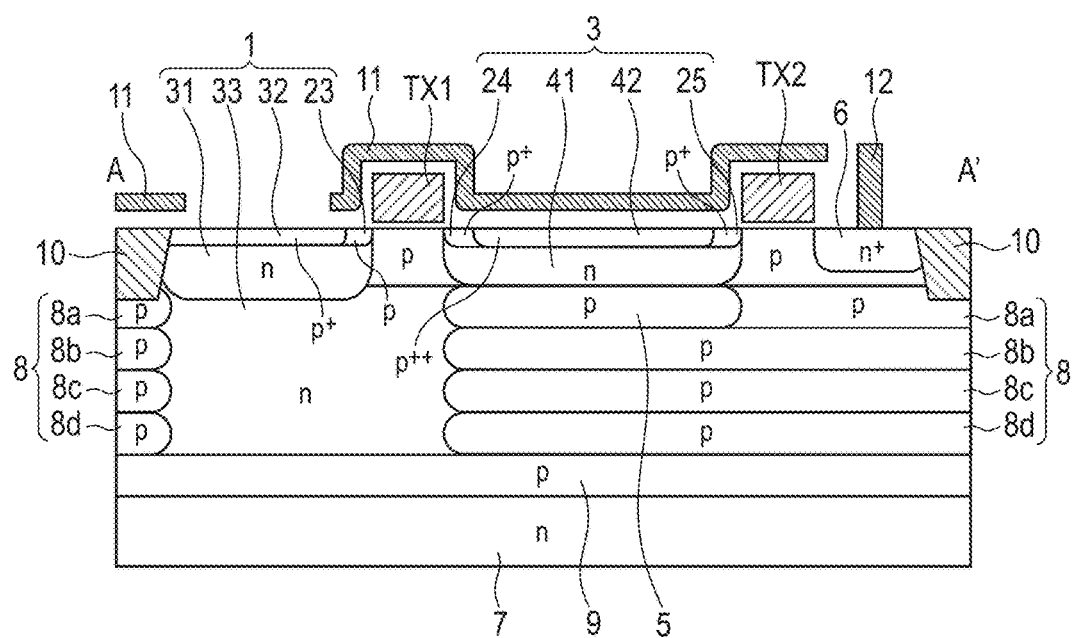

FIG. 10A and FIG. 10B are schematic cross-sectional views illustrating the structures of the solid-state imaging devices according to the present embodiment. Incidentally, FIGS. 10A and 10B are cross-sectional views of portions corresponding to the portion taken along the line A-A' in FIG. 2.

The solid-state imaging device according to the present embodiment is similar to the solid-state imaging devices according to the first to fourth embodiments, except that the structures of the p-type semiconductor region 32 of the photoelectric conversion portion 1 and the p-type semiconductor region 42 of the charge holding portion 3 are different from those in the first to fourth embodiments. Specifically, the solid-state imaging device according to the present embodiment has an electric field suppression layer 23 which has a lower impurity concentration than that of the p-type semiconductor region 32, on the end in the side of the charge holding portion, in other words, on the end in the side of the gate electrode TX1, of the p-type semiconductor region 32, as is illustrated in FIG. 10A and FIG. 10B. In addition, the solid-state imaging device has an electric field suppression layer 24 which has a lower impurity concentration than that in the p-type semiconductor region 42, on the end in the side of the photoelectric conversion portion, in other words, on the end in the side of the gate electrode TX1, of the p-type semiconductor region 42. In addition, the solid-state imaging device has an electric field alleviation layer 25 which has a lower impurity concentration than that in the p-type semiconductor region 42, on the end in the side of the FD region 6, in other words, on the end in the side of the gate electrode TX2, of the p-type semiconductor region 42. FIG. 10A is a schematic cross-sectional view in the case where the configuration of the present embodiment has been applied to the solid-state imaging devices of the first, second and fourth embodiments. In addition, FIG. 10B is a schematic cross-sectional view in the case where the configuration of the present embodiment has been applied to the solid-state imaging device of the third embodiment.

When the electric charges are transferred, an electric field is generated which is caused by a potential difference between a voltage (for instance, 3.3 V) to be applied to the gate electrodes TX1 and TX2 and a potential (for instance, 0 V) of the p-type semiconductor regions 32 and 42. There is a concern that unnecessary electric charges are generated by a phenomenon which is referred to as impact ionization that occurs due to this electric field and/or an electric field in the depletion layer region which is generated at the p-n junction in the photoelectric conversion portion 1 and the charge holding portion 3, and that the noise results in increasing.

When the electric field suppression layers 23, 24 and 25 are provided, potential gradients can be suppressed in between the gate electrode TX1 and the photoelectric conversion portion 1, in between the gate electrode TX1 and the charge holding portion 3, and in between the charge holding portion 3 and the gate electrode TX2, when the electric charges are transferred. Thereby, the electric field intensity in each of the above described portions can be weakened, and the increase of the noise can be prevented.

In addition, potential barriers are also lowered in between the photoelectric conversion portion 1 and the first transfer transistor 14, in between the first transfer transistor 14 and the charge holding portion 3, and in between the charge holding portion 3 and the second transfer transistor 15. Accordingly, an effect of facilitating the transfer of the electric charges is also obtained.

Thus, according to the present embodiment, the electric field suppression layers 23, 24 and 25 are provided on the ends of the p-type semiconductor regions 32 and 42. Accordingly, the noise is reduced which is generated when the signal charge is transferred, and the charge can be easily transferred.

[Sixth Embodiment]

A solid-state imaging device according to a sixth embodiment of the present invention will be described below with reference to FIG. 11A and FIG. 11B. Similar components to those in the solid-state imaging devices according to the first to fifth embodiments illustrated in FIG. 1 to FIG. 10B are designated by the same reference numerals, and the description will be omitted or simplified.

Figure 11A:
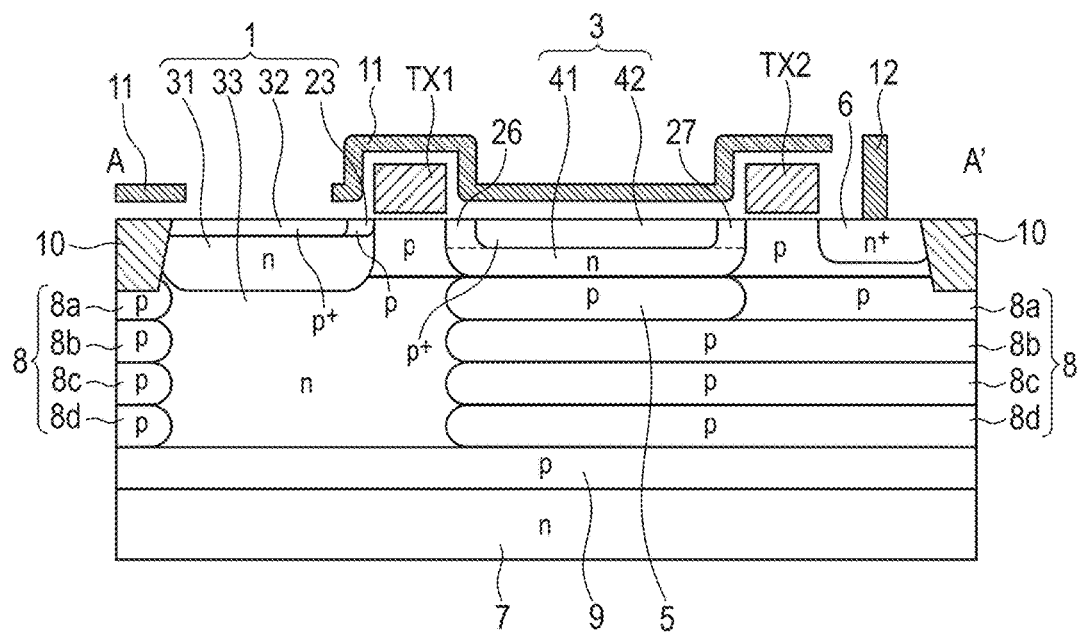
FIG. 11A and FIG. 11B are schematic cross-sectional views illustrating structures of imaging regions of solid-state imaging devices according to a sixth embodiment of the present invention.
Figure 11B:
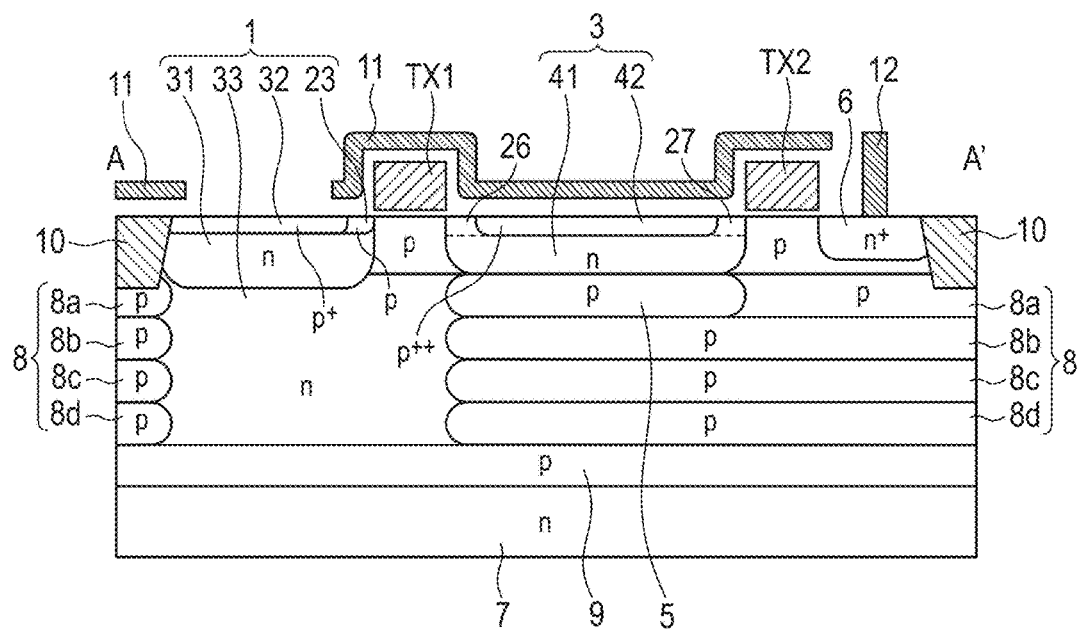

FIG. 11A and FIG. 11B are schematic cross-sectional views illustrating the structures of the solid-state imaging devices according to the present embodiment. Incidentally, FIG. 11A and FIG. 11B are cross-sectional views of portions corresponding to the portion taken along the line A-A' in FIG. 2.

The solid-state imaging device according to the present embodiment is similar to the solid-state imaging device according to the fifth embodiment, except that the structure of the n-type semiconductor region 41 of the charge holding portion 3 is different from that in the fifth embodiment. Specifically, the solid-state imaging device according to the present embodiment has a transfer support layer 26 provided in the side of the photoelectric conversion portion of the p-type semiconductor region 42, specifically, in the vicinity of the gate electrode TX1, as is illustrated in FIG. 11A and FIG. 11B. In addition, a transfer support layer 27 is provided in the side of the FD region 6 of the p-type semiconductor region 42, specifically, in the vicinity of the gate electrode TX2. The transfer support layers 26 and 27 are formed of an n-type semiconductor region which has conductivity opposite to that in the p-type semiconductor region 42. In the examples of FIG. 11A and FIG. 11B, a part of the n-type semiconductor region 41 is the transfer support layers 26 and 27.

FIG. 11A is a schematic cross-sectional view in the case where the transfer support layers 26 and 27 are provided in the solid-state imaging device according to the fifth embodiment illustrated in FIG. 10A. In addition, FIG. 11B is a schematic cross-sectional view in the case where the auxiliary transfer layers 26 and 27 are provided in the solid-state imaging device according to the fifth embodiment illustrated in FIG. 10B. It can be also said that the solid-state imaging device according to the present embodiment has the n-type transfer support layers 26 and 27 arranged in place of the p-type electric field suppression layers 24 and 25, from a relationship between the solid-state imaging device according to the present embodiment and the solid-state imaging device according to the fifth embodiment illustrated in FIG. 10A and FIG. 10B.

When the transfer support layers 26 and 27 are provided, an effect of reducing the electric field is obtained that is generated in each of the portions when the electric charges are transferred, which is similar to the effect described in the fifth embodiment. In addition, potential barriers are lowered in between the photoelectric conversion portion 1 and the first transfer gate TX1, in between the first transfer gate TX1 and the charge holding portion 3, and in between the charge holding portion 3 and the second transfer gate TX2. Accordingly, an effect of facilitating the transfer of the electric charges is also obtained.

For information, both of the two transfer support layers 26 and 27 do not necessarily need to be provided, and only any one layer may be provided. In this case as well, a potential barrier in a portion in which the transfer support layer 26 or the transfer support layer 27 has been arranged is lowered, and accordingly an effect of facilitating the transfer of the electric charges is obtained.

The transfer support layers 26 and 27 may be simultaneously formed in a step of forming the n-type semiconductor region 41 (as a part of the n-type semiconductor region 41), or may also be formed in a step different from the step of forming the n-type semiconductor region 41.

Thus, according to the present embodiment, the transfer support layers 26 and 27 are provided on the ends of the p-type semiconductor region 42, and accordingly the electric charges can be easily transferred.

[Seventh Embodiment]

A solid-state imaging device according to a seventh embodiment of the present invention will be described below with reference to FIG. 12A and FIG. 12B. Similar components to those in the solid-state imaging devices according to the first to sixth embodiments illustrated in FIG. 1 to FIG. 11B are designated by the same reference numerals, and the description will be omitted or simplified.

Figure 12A:
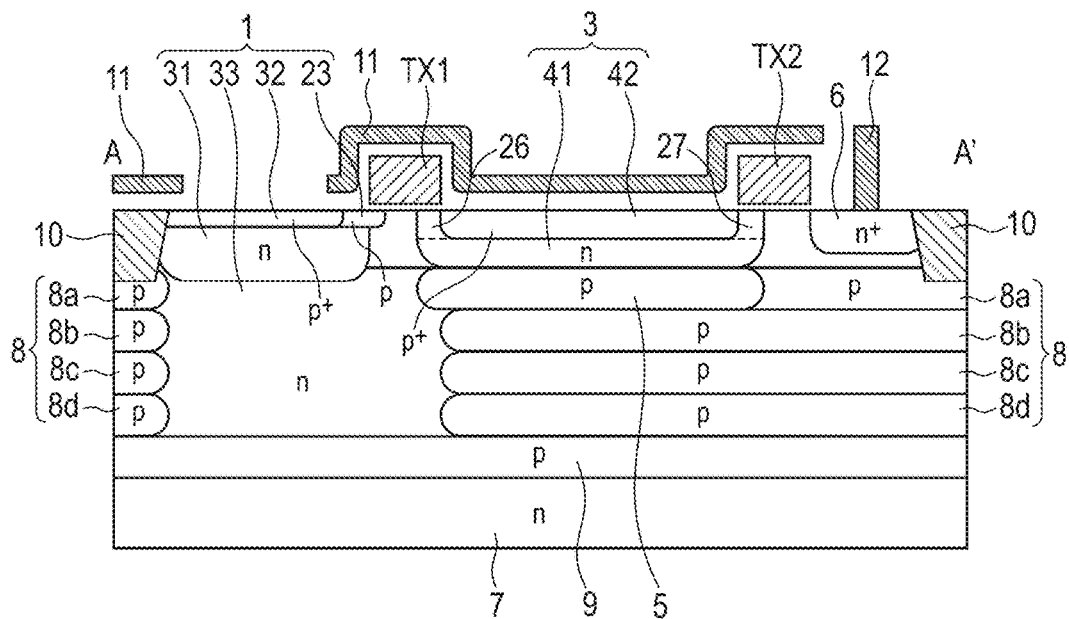
FIG. 12A and FIG. 12B are schematic cross-sectional views illustrating structures of imaging regions of solid-state imaging devices according to a seventh embodiment of the present invention.
Figure 12B:
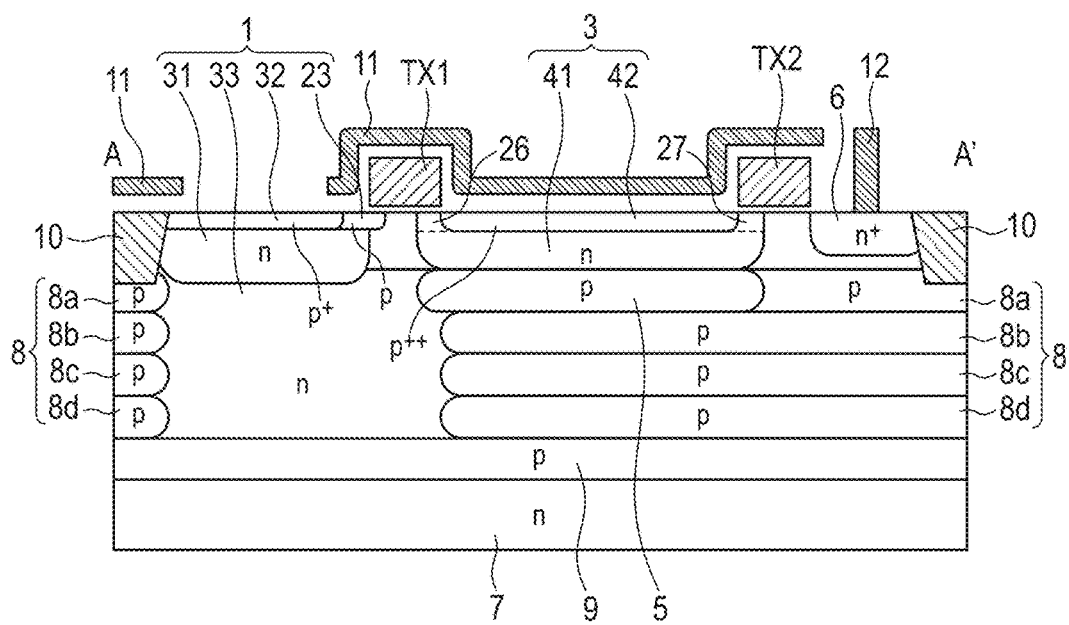

FIG. 12A and FIG. 12B are schematic cross-sectional views illustrating the structures of the solid-state imaging devices according to the present embodiment. Incidentally, FIG. 12A and FIG. 12B are cross-sectional views of portions corresponding to the portion taken along the line A-A' in FIG. 2.

The solid-state imaging device according to the present embodiment is similar to the solid-state imaging device according to the sixth embodiment, except that the electric field suppression layer 23 and the transfer support layers 26 and 27 extend to regions below the gate electrodes TX1 and TX2. Specifically, in the solid-state imaging device according to the present embodiment, the electric field suppression layer 23 extends to a region below the gate electrode TX1, as is illustrated in FIG. 12A and FIG. 12B. In addition, the transfer support layer 26 extends to a region below the gate electrode TX1. In addition, the transfer support layer 27 extends to a region below the gate electrode TX2. FIG. 12A is an example in which the configuration of the present embodiment has been applied to the solid-state imaging device according to the sixth embodiment illustrated in FIG. 11A, and FIG. 12B is an example in which the configuration of the present embodiment is applied to the solid-state imaging device according to the sixth embodiment illustrated in FIG. 11B.

The electric field suppression layer 23 and the transfer support layers 26 and 27 are arranged so as to extend to the lower regions of the gate electrodes TX1 and TX2, and thereby potential barriers below the gate electrodes TX1 and TX2 can be reduced. Thereby, the electric charges can be further easily transferred.

For information, all of the electric field suppression layer 23 and the transfer support layers 26 and 27 do not necessarily need to be formed so as to extend to the lower regions of the gate electrodes TX1 and TX2. It is also acceptable to form any one or two layers so as to extend to the lower regions of the gate electrodes TX1 and TX2.

Thus, according to the present embodiment, the electric field suppression layer 23 and the transfer support layers 26 and 27 are formed so as to extend to the lower regions of the gate electrodes TX1 and TX2, and accordingly the electric charges can be easily transferred.

[Eighth Embodiment]

An imaging system according to an eighth embodiment of the present invention will be described below with reference to FIG. 13. Similar components to those in the solid-state imaging devices according to the first to seventh embodiments illustrated in FIG. 1 to FIG. 12B are designated by the same reference numerals, and the description will be omitted or simplified.

Figure 13:
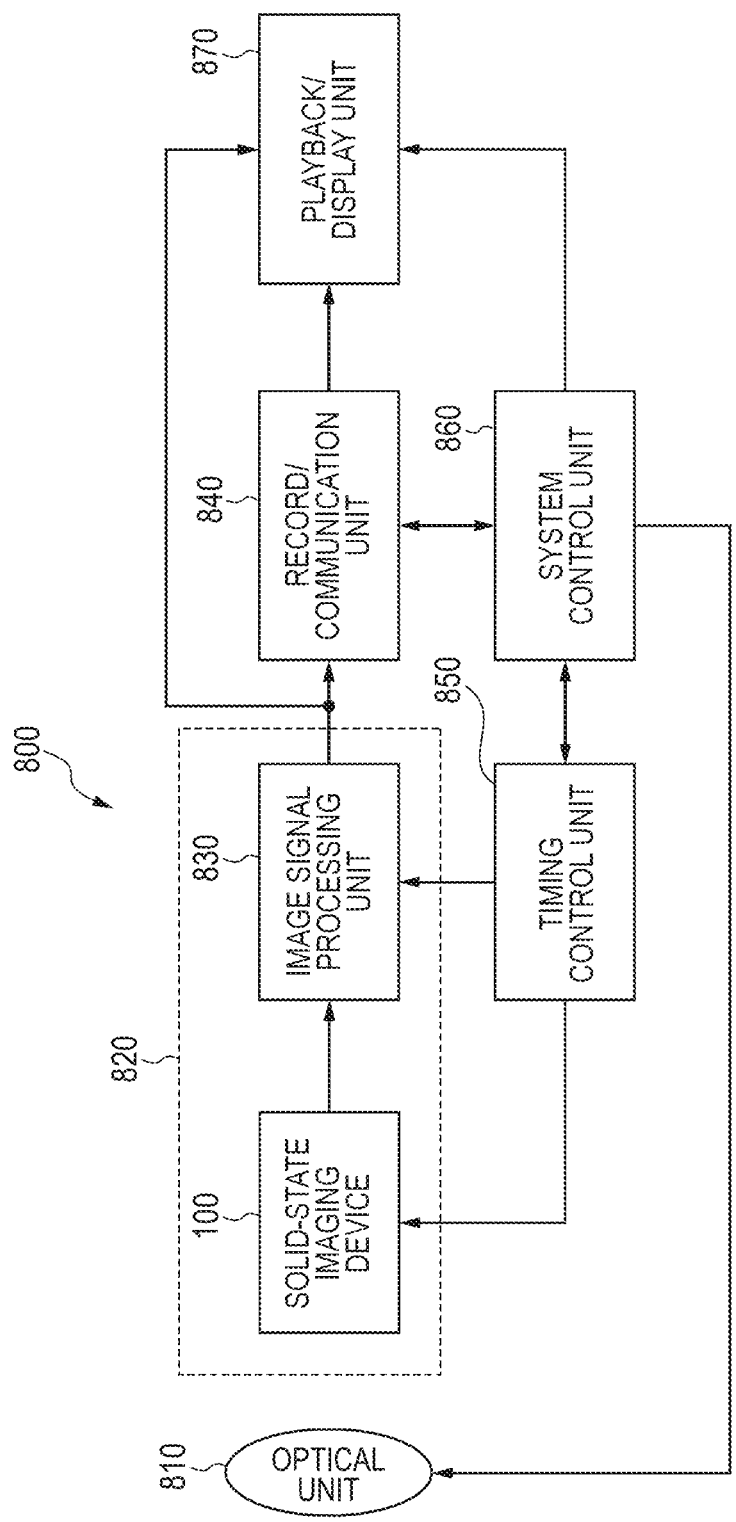
FIG. 13 is a schematic view illustrating a configuration of an imaging system according to an eighth embodiment of the present invention.

FIG. 13 is a view illustrating a configuration example of an imaging system according to the present embodiment. An imaging system 800 includes, for instance, an optical unit 810, a solid-state imaging device 100, an image signal processing unit 830, a record/communication unit 840, a timing control unit 850, a system control unit 860, and a playback/display unit 870. The imaging device 820 has the solid-state imaging device 100 and the video signal processing unit 830. The solid-state imaging device 100 employs any of the solid-state imaging devices 100 which have been described in the previous embodiments.

The optical unit 810 that is an optical system such as a lens focuses an image of light emitted from an object onto a pixel unit of the solid-state imaging device 100, in which a plurality of unit pixels P1 are two-dimensionally arranged, and forms an image of the object (object image) on the pixel unit. The solid-state imaging device 100 outputs signals according to the light of which the image has been focused on the pixel unit, on the timing based on the signal output from the timing control unit 850. The signals output from the solid-state imaging device 100 are input into the image signal processing unit 830, and the image signal processing unit 830 performs signal processing with a specified method by a program or the like. The signals obtained by the processing in the image signal processing unit 830 are transmitted to the record/communication unit 840 as image data. The record/communication unit 840 transmits signals for forming an image to the playback/display unit 870, and makes the playback/display unit 870 playbacks and displays a moving image or a still image. The record/communication unit 840 also communicates with the system control unit 860 by receiving the signals transmitted from the image signal processing unit 830, and besides, performs an operation of recording the signals for forming the image on an unillustrated recording medium.

The system control unit 860 is a unit for collectively controlling an operation of the imaging system, and controls drives of the optical unit 810, the timing control unit 850, the record/communication unit 840 and the playback/display unit 870. In addition, the system control unit 860 is provided, for instance, with an unillustrated storage device that is a recording medium, and records a program and the like which are necessary for controlling the operation of the imaging system, in the storage device. The system control unit 860 also supplies, for instance, a signal which switches driving modes according to an operation of a user, into the imaging system. Specific examples include a signal for a change of a row to be read out or a row to be reset, a signal for a change of an angle of view, which accompanies an operation of an electronic zoom, and a signal for a shift of an angle of view, which accompanies electronic vibration control. The timing control unit 850 controls the driving timings for the solid-state imaging device 100 and the image signal processing unit 830 based on the control by the system control unit 860.

Thus, the imaging system is configured to which any of the solid-state imaging devices according to the first to seventh embodiments is applied, and thereby an imaging system can be configured which uses a solid-state imaging device that has a function of a whole-pixel simultaneous electronic shutter and has high performance.

[Modified Embodiment]

The present invention is not limited to the above described embodiments, but can be modified in various ways.

The above described embodiments have been described assuming that the solid-state imaging device has the function of the whole-pixel simultaneous electronic shutter, for instance, but the configurations of the solid-state imaging devices described in the above described embodiments are not necessarily limited only to the solid-state imaging device which operates the whole-pixel simultaneous electronic shutter.

In addition, in the above described third embodiment, the p-type semiconductor region 42 is formed so as to have a high impurity concentration, and in the above described first and second embodiments, the p-type semiconductor region 42 is thickly formed. However, the p-type semiconductor region 42 may also be formed so as to be thick and have a high impurity concentration.

In addition, in the above described sixth embodiment, the transfer support layers 26 and 27 are provided in the vicinity of the gate electrodes TX1 and TX2 of the p-type semiconductor region 42, but the transfer support layer may also be provided in the vicinity of the gate electrode TX1 of the p-type semiconductor region 32, in place of the electric field suppression layer 23.

In addition, in the above described seventh embodiment, an example has been shown in which the electric field suppression layer 23 is formed so as to extend to the lower region of the gate electrode TX1, but in the above described fifth embodiment as well, the electric field suppression layer 24 may be formed so as to extend to the lower region of the gate electrode TX1. In addition, in the above described fifth embodiment, the electric field suppression layer 25 may also be formed so as to extend to the lower region of the gate electrode TX2.

In addition, the electric field suppression layer shown in the fifth embodiment and the auxiliary transfer layer shown in the sixth embodiment may be provided also in the vicinity of the gate electrode OFG of the p-type semiconductor region 32 which constitutes the photoelectric conversion portion 1. In this case, these electric field suppression layer and transfer support layer may also be formed so as to extend to the lower region of the gate electrode OFG, similarly to the case of the seventh embodiment.

In addition, in the above described second embodiment, the gate electrode TX1 has been formed so as to extend to the upper part of the charge holding portion 3 in the solid-state imaging device of the first embodiment, but the gate electrode TX1 may be formed so as to extend to the upper part of the charge holding portion 3 also in the solid-state imaging devices of the third to seventh embodiments.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-051198, filed Mar. 14, 2014, and Japanese Patent Application No. 2014-164106, filed Aug. 12, 2014, which are hereby incorporated by reference herein in their entirety.

What is claimed is:

1. A solid-state imaging device comprising:
a plurality of pixels each of which includes:
a photoelectric conversion portion which photoelectrically converts incident light to generate a signal charge;
a charge holding portion that accumulates the signal charge transferred from the photoelectric conversion portion;
a floating diffusion region to which the signal charge of the charge holding portion is transferred;
a first transfer gate configured to transfer the signal charge from the photoelectric conversion portion to the charge holding portion; and
a second transfer gate configured to transfer the signal charge from the charge holding portion to the floating diffusion region,
wherein:
the photoelectric conversion portion includes a first semiconductor region of a first conductivity type, and a second semiconductor region of a second conductivity type including a majority carrier of a polarity of the signal charge formed under the first semiconductor region,
the charge holding portion includes a third semiconductor region of the first conductivity type, and a fourth semiconductor region of the second conductivity type formed under the third semiconductor region, in a cross section including the charge holding portion, the floating diffusion region and the second transfer gate, a first side edge of the fourth semiconductor region on the floating diffusion region side is provided between the floating diffusion region and a first side edge of the third semiconductor region on the floating diffusion region side, and in the cross section, the floating diffusion region and the fourth semiconductor region are isolated by a semiconductor region of the first conductivity type, the semiconductor region being in contact with a surface of a semiconductor substrate.

2. The solid-state imaging device according to claim 1, wherein the fourth semiconductor region has a higher impurity concentration than the second semiconductor region.

3. The solid-state imaging device according to claim 1, wherein an area of the charge holding portion is larger than an area of the photoelectric conversion portion.

4. The solid-state imaging device according to claim 1, wherein the charge holding portion further has a fifth semiconductor region of the first conductivity type, which is formed in contact with a bottom of the fourth semiconductor region.

5. The solid-state imaging device according to claim 1, wherein the photoelectric conversion portion further has a sixth semiconductor region which is formed in contact with an end of the first semiconductor region at a side of the charge holding portion, and has a lower impurity concentration than the first semiconductor region.

6. The solid-state imaging device according to claim 1, wherein the charge holding portion further has a seventh semiconductor region of the first conductivity type, which is formed in contact with an end of the third semiconductor region at a side of the floating diffusion region, and has a lower impurity concentration than the third semiconductor region.

7. The solid-state imaging device according to claim 1, wherein the charge holding portion further has an eighth semiconductor region of the first conductivity type, which is formed in contact with an end of the third semiconductor region at a side of the photoelectric conversion portion, and has a lower impurity concentration than the third semiconductor region.

8. The solid-state imaging device according to claim 1, wherein the charge holding portion further has a ninth semiconductor region of the second conductivity type, which is arranged in a vicinity of an end of the third semiconductor region at a side of the floating diffusion region.

9. The solid-state imaging device according to claim 1, wherein the charge holding portion further has a tenth semiconductor region of the second conductivity type, which is arranged in a vicinity of an end of the third semiconductor region at a side of the photoelectric conversion portion.

10. The solid-state imaging device according to claim 5, wherein the sixth semiconductor region extends to a region below the first transfer gate.

11. The solid-state imaging device according to claim 8, wherein the ninth semiconductor region extends to a region below the second transfer gate.

12. The solid-state imaging device according to claim 9, wherein the tenth semiconductor region extends to a region below the first transfer gate.

13. The solid-state imaging device according to claim 1, wherein the first transfer gate extends to an upper part of the charge holding portion.

14. The solid-state imaging device according to claim 1, wherein in the cross section, a part of the fourth semiconductor region is provided under the second transfer gate.

15. The solid-state imaging device according to claim 14, wherein a p-n junction between the third semiconductor region and the fourth semiconductor region is positioned at a different depth from a p-n junction between the first semiconductor region and the second semiconductor region.

16. The solid-state imaging device according to claim 1, wherein the fourth semiconductor region and the floating diffusion region are isolated by a semiconductor region of the first conductivity type.

17. The solid-state imaging device according to claim 1, wherein in a second cross section including the photoelectric conversion portion, the charge holding portion and the first transfer gate, a second side edge of the fourth semiconductor region on the photoelectric conversion portion side is provided between the second semiconductor region and a second side edge of the third semiconductor region on the photoelectric conversion portion side.

18. The solid-state imaging device according to claim 17, wherein in the second cross section, a part of the fourth semiconductor region is provided under the first transfer gate.

19. The solid-state imaging device according to claim 17, wherein a plane including the first cross section is different and distant from a plane including the second section.

20. An imaging system comprising:
   the solid-state imaging device according to claim 1; and
   an optical system which forms an object image on the solid-state imaging device.

* * * * *